(12) United States Patent
Hanamura

(10) Patent No.: US 11,026,301 B2
(45) Date of Patent: Jun. 1, 2021

(54) ORGANIC EL DEVICE, METHOD OF MANUFACTURING ORGANIC EL DEVICE, AND ELECTRONIC APPARATUS

(71) Applicant: SEIKO EPSON CORPORATION, Tokyo (JP)

(72) Inventor: Yuki Hanamura, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/053,246

(22) Filed: Aug. 2, 2018

(65) Prior Publication Data
US 2018/0343714 A1 Nov. 29, 2018

Related U.S. Application Data

(60) Division of application No. 15/491,277, filed on Apr. 19, 2017, now Pat. No. 10,098,192, which is a
(Continued)

(30) Foreign Application Priority Data

Oct. 29, 2012 (JP) .................................. 2012-237564

(51) Int. Cl.
*H05B 33/04* (2006.01)
*H05B 33/22* (2006.01)
(Continued)

(52) U.S. Cl.
CPC ........... *H05B 33/04* (2013.01); *H01L 27/322* (2013.01); *H01L 27/3248* (2013.01);
(Continued)

(58) Field of Classification Search
CPC ........ H05B 33/04; H05B 33/14; H05B 33/22; H05B 33/10; H01L 27/322; H01L 27/3248; G02B 5/201
See application file for complete search history.

(56) References Cited

U.S. PATENT DOCUMENTS 5,689,318 A 11/1997 Matsuyama et al.
7,187,006 B2 3/2007 Hayashi
(Continued)

FOREIGN PATENT DOCUMENTS

JP 62-196603 A 8/1987
JP 07-120610 A 5/1995
(Continued)

OTHER PUBLICATIONS

Kawaguchi et al., Japanese Patent Application Publication 2003-282259, Oct. 2003, machine translation.*
(Continued)

*Primary Examiner* — Tracie Y Green
(74) *Attorney, Agent, or Firm* — Oliff PLC

(57) ABSTRACT

The organic EL device includes a base material as a substrate, a plurality of organic EL elements disposed on the based materials, a seal layer covering the plurality of organic EL elements to seal, color layers of at least red, green, and blue corresponding to a plurality of organic EL elements and formed on the seal layer, and a convex portion which is formed by dividing each of colored layers with different colors on the seal layer, and whose height is lower than the height of a colored layer of at least red, green, blue on the seal layer. The convex portion has a property of optical transparency, and is formed using a photosensitive resin material which is a main material of the colored layers, for example.

19 Claims, 12 Drawing Sheets

Related U.S. Application Data continuation of application No. 15/200,739, filed on Jul. 1, 2016, now Pat. No. 9,661,694, which is a division of application No. 14/795,575, filed on Jul. 9, 2015, now Pat. No. 9,661,693, which is a division of application No. 14/044,371, filed on Oct. 2, 2013, now Pat. No. 9,111,881.

(51) Int. Cl.
*H05B 33/14* (2006.01)
*H05B 33/10* (2006.01)
*H01L 27/20* (2006.01)
*H01L 27/32* (2006.01)
*G02B 5/20* (2006.01)

(52) U.S. Cl.
CPC ............. *H05B 33/10* (2013.01); *H05B 33/14* (2013.01); *H05B 33/22* (2013.01); *G02B 5/201* (2013.01)

(56) References Cited

U.S. PATENT DOCUMENTS

| | | | | |
|---|---|---|---|---|
| 7,960,908 | B2* | 6/2011 | Okutani | H01L 27/322 313/504 |
| 8,063,552 | B2* | 11/2011 | Cok | H05B 33/22 313/503 |
| 8,288,784 | B2 | 10/2012 | Cho | |
| 9,111,881 | B2* | 8/2015 | Hanamura | H01L 27/322 |
| 9,661,693 | B2* | 5/2017 | Hanamura | H05B 33/04 |
| 9,661,694 | B2* | 5/2017 | Hanamura | H05B 33/14 |
| 10,098,192 | B2* | 10/2018 | Hanamura | H05B 33/22 |
| 2002/0163615 | A1 | 11/2002 | Fujioka et al. | |
| 2003/0230972 | A1 | 12/2003 | Cok | |
| 2006/0202613 | A1* | 9/2006 | Kawaguchi | H01L 27/322 313/506 |
| 2006/0214573 | A1* | 9/2006 | Maeda | H01L 27/3211 313/506 |
| 2007/0015429 | A1* | 1/2007 | Maeda | H01L 51/5206 445/24 |
| 2007/0210702 | A1 | 9/2007 | Nakamura | |
| 2007/0211195 | A1* | 9/2007 | Sohn | G02F 1/133345 349/106 |
| 2007/0290201 | A1 | 12/2007 | Hoffmann et al. | |
| 2008/0036367 | A1 | 2/2008 | Eida et al. | |
| 2008/0224968 | A1 | 9/2008 | Kashiwabara | |
| 2009/0283786 | A1* | 11/2009 | Kobayashi | H01L 51/5262 257/98 |
| 2010/0053038 | A1* | 3/2010 | Sakamoto | H01L 51/5265 345/76 |
| 2011/0049591 | A1* | 3/2011 | Nakatani | H04N 5/363 257/292 |
| 2011/0084290 | A1 | 4/2011 | Nakamura et al. | |
| 2011/0148944 | A1* | 6/2011 | Kobayashi | G09G 3/3225 345/690 |
| 2011/0233600 | A1* | 9/2011 | Lin | H01L 27/3209 257/99 |
| 2011/0261477 | A1 | 10/2011 | Okumoto et al. | |
| 2012/0038267 | A1 | 2/2012 | Hanamura et al. | |
| 2012/0070942 | A1 | 3/2012 | Fedorovskaya et al. | |
| 2012/0169977 | A1 | 7/2012 | Tsubata | |
| 2012/0205698 | A1 | 8/2012 | Yamazaki et al. | |
| 2012/0226979 | A1 | 9/2012 | Harberts et al. | |
| 2013/0236999 | A1* | 9/2013 | Lee | G03F 7/0046 438/35 |
| 2014/0117334 | A1 | 5/2014 | Nakamura et al. | |
| 2014/0213004 | A1 | 7/2014 | Yamazaki et al. | |
| 2014/0284590 | A1 | 9/2014 | Nakazawa et al. | |
| 2015/0021583 | A1 | 1/2015 | Yamazaki et al. | |

FOREIGN PATENT DOCUMENTS

| | | | | |
|---|---|---|---|---|
| JP | H07-281169 | A | | 10/1995 |
| JP | H07-318713 | A | | 12/1995 |
| JP | 08-122514 | A | | 5/1996 |
| JP | 2003-282259 | A | | 10/2003 |
| JP | 2003282259 | A | * | 10/2003 ........... H01L 27/322 |
| JP | 2004-039388 | A | | 2/2004 |
| JP | 2006-243171 | A | | 9/2006 |
| JP | 2006-251135 | A | | 9/2006 |
| JP | 2008-165108 | A | | 7/2008 |
| JP | 2008-225179 | A | | 9/2008 |
| JP | 2009-244301 | A | | 10/2009 |
| JP | 2010-027265 | A | | 2/2010 |
| JP | 2010-175920 | A | | 8/2010 |
| JP | 2010211984 | A | * | 9/2010 |
| JP | 2011100554 | A | | 5/2011 |
| JP | 2011-113008 | A | | 6/2011 |
| JP | 2012-038677 | A | | 2/2012 |
| JP | 2012047764 | A | | 3/2012 |
| JP | 2012186155 | A | | 9/2012 |
| JP | 2012-194550 | A | | 10/2012 |
| JP | 2012-209116 | A | | 10/2012 |
| JP | 2012209116 | A | * | 10/2012 |
| TW | I270024 | B | | 1/2007 |
| TW | 201008365 | A | | 2/2010 |
| WO | 2006/022123 | A1 | | 3/2006 |

OTHER PUBLICATIONS

Shininchi, Iwata, Japanese Patent Application Publication 2012-209116, Oct. 2012, machine translation.*
JP2010-211984_machine-translation_9-2010.pdf (Year: 2010).*

* cited by examiner

ORGANIC EL DEVICE, METHOD OF MANUFACTURING ORGANIC EL DEVICE, AND ELECTRONIC APPARATUS This is a Division of application Ser. No. 15/491,277 filed Apr. 19, 2017, which in turn is a division of application Ser. No. 15/200,739 filed on Jul. 1, 2016 (now U.S. Pat. No. 9,661,694), which in turn is a division of application Ser. No. 14/795,575 filed Jul. 9, 2015 (now U.S. Pat. No. 9,661,693), which in turn is a Division of application Ser. No. 14/044,371 filed Oct. 2, 2013 (now U.S. Pat. No. 9,111,881), which claims the benefit of Japanese Patent Application No. 2012-237564 filed Oct. 29, 2012. The disclosure of the prior applications is hereby incorporated by reference herein in its entirety.

BACKGROUND

1. Technical Field

The present invention relates to an organic EL device including an electroluminescent (EL) element, a method of manufacturing the organic EL device, and an electronic apparatus.

2. Related Art

Since an organic EL element as a light emitting element may become small and thin compared to a light emitting diode (LED), the organic EL element may be applied to a micro-display such as a head mounted display (HMD), an electronic view finder (EVF), and the like.

As means that realizes a color display in the micro-display, a configuration combining the organic EL element from which white light emission is obtained and a color filter has been considered. However, even if color layers of red (R), green (G), and blue (b) color filters is formed corresponding to a fine pixel using the photolithography method, due to a subsequent manufacturing process, for example, an influence of temperature, a portion of the colored layer is peeled off.

In order to improve peeling off of the colored layer, for example, in JP-A-2012-38677, provided is an organic EL device superimposing color layers of different colors between pixels and a manufacturing method thereof. In addition, a portion where colored layers of different colors are superimposed has a significantly lowered transmission rate, so that it is illustrated that the superimposed portion is set to a light blocking region.

However, in JP-A-2012-38677 described above, colored layers of the same color are disposed in a column direction, colored layers of different colors are disposed in a row direction orthogonal to the column direction. Accordingly, colored layers of different colors are superimposed between adjacent pixels in the column direction, and even light, which is emitted from the organic EL element and transmits a portion where the colored layers are superimposed, may be visible. Accordingly, in viewing angle characteristics in the column direction, there are problems that a color balance of R light, G light, and B light which transmit colored layers is lowered, and the symmetry on the viewing angle characteristics is deteriorated. Further, such problems become remarkable as a pixel gets finer.

SUMMARY

The present invention can be realized in the following forms or application examples.

Application Example 1

According to this application example, there is provided an organic EL device, including a substrate, a plurality of organic EL elements disposed on the substrate, a seal layer covering the plurality of organic EL elements to seal, colored layers of at least red, green, and blue which corresponds to the plurality of organic EL elements and is formed on the seal layer, and a convex portion which is formed by dividing each of the colored layers of different colors on the seal layer and whose height is lower than the height of the colored layers.

According to this application example, the convex portion is formed on the organic EL element side between colored layers of different colors, so that, compared to a case where the convex portion is not formed, it is possible to reduce the rate of the light emission from the organic EL element in a boundary of colored layers transmitting the colored layers of other colors other than a colored layer which the light has to originally transmit. Therefore, it is possible to inhibit the symmetry on the viewing angle characteristics from being lowered and to provide the organic EL device having excellent display characteristics.

In addition, compared to a case where the convex portion is not formed between the colored layers of different colors, the color layers are formed in contact not only with the seal layer but also with the convex portion, thereby increasing an area of a portion in contact with the colored layer and improving adhesion of the colored layer.

Application Example 2

In the organic EL device according to the application example, the convex portion has an optical transparency, and the top portion of the convex portion is covered by the colored layer of at least one color.

According to the configuration, light emission from the organic EL element may transmit the convex portion, so that, compared to a case where the convex portion is formed of a light blocking member, light emission from the organic EL element is effectively used, and the organic EL device having characteristics of high brightness may be provided. In addition, the top portion of the convex portion is covered by a color layer of at least one color, so that light leakage from the top portion may be prevented from occurring.

Application Example 3

In the organic EL device according to the application example, it is preferable that the convex portion be made of a photosensitive resin material configuring the colored layer.

According to the configuration, the convex portion and the colored layer are configured mainly using the same photosensitive resin material, so that the adhesion between the convex portion and the colored layer may be improved. In addition, the convex portion is formed by a photolithography method, so that, even if pixels are in the high definition, it is possible to form an effective convex portion in response thereto.

Application Example 4

In the organic EL device according to the application example, the convex portion may be made of a metal material or a dielectric material.

According to the configuration, it is possible to configure a light blocking convex portion using the metal material, and to realize an excellent symmetry in the viewing angle characteristics. In addition, in a case where the seal layer is configured using an inorganic material, by using the dielectric material, it is possible to configure the convex portion having a more excellent adhesion to the seal layer.

Application Example 5

In the organic EL device according to the application example, it is preferable that an area of the bottom surface in contact with the seal layer of the convex portion be larger than an area of the top portion of the convex portion.

According to the configuration, the adhesion of the convex portion to the seal layer may be increased.

Application Example 6

In the organic EL device according to the application example, it is preferable that the organic EL element and the colored layer be provided in each sub-pixel, and the convex portion be formed so as to divide the sub-pixel.

According to the configuration, for example, compared to a case where the convex portion is formed in a strip shape (streaky shape), a contact area between the colored layer and the convex portion is increased, so that an adhesion to the convex portion of the colored layer may be improved.

Application Example 7

In the organic EL device according to the application example, it is preferable that the seal layer be sequentially stacked from the plurality of organic EL elements side, and a first seal layer, a flattened layer, and a second seal layer made of inorganic material be included.

According to the configuration, there is a concern that the surface of the first seal layer has convex and concave occurring by receiving an influence of the plurality of organic EL elements formed on the lower layer. By disposing a second seal layer through a flattened layer with respect to the first seal layer, a colored layer formed on the seal layer is unlikely to receive an influence of the convex and concave, and it is likely to configure a colored layer with a uniform thickness. In addition, the flattened layer is present between the first seal layer and the second seal layer, so that it is possible to reduce occurrence of crack on the second seal layer which is caused by the convex and concave of the first seal layer by thermal expansion and contraction. Therefore, it is possible to realize a seal layer having higher sealing performance. That is, it is possible to provide an organic EL device having a high reliability in light emitting durability.

Application Example 8

According to this application example, there is provided a manufacturing method of an organic EL device, including a process of forming a seal layer covering and sealing a plurality of organic EL elements disposed on a substrate, a process of forming a convex portion on the seal layer between adjacent sub-pixels of different colors among sub-pixels of at least red, green, and blue, and a color filter forming process of forming each of the colored layers of at least red, green, and blue corresponding to the sub-pixel by coating a photosensitive resin material including a color material using a spin coating method. The process of forming a convex portion forms the convex portion so that the height of the convex portion may be lower than the height of the colored layer on the seal layer.

According to this application example, the convex portion is formed on an organic EL element side between colored layers in adjacent sub-pixels of different colors, so that, compared to a case where the convex portion is not formed, it is possible to reduce the rate of the light emission from the organic EL element in a boundary of colored layers transmitting the colored layers of other colors other than a colored layer which the light has to originally transmit. Therefore, the symmetry on the viewing angle characteristics may be inhibited from being lowered and the organic EL device having excellent display characteristics may be manufactured.

In addition, compared to a case where the convex portion is not formed between the colored layers in sub-pixels of different colors, the colored layer is formed in contact not only with the seal layer but also with the convex portion, so that a portion in contact with the colored layer is increased, and it is possible to manufacture the organic EL device with improved adhesion of the colored layer.

Furthermore, the colored layer is formed by coating the photosensitive resin material including a coloring material with respect to a substrate where the convex portion is formed using a spin coating method, so that, compared to a case where the convex portion is not formed, a space between the convex portions is easily filled with the photosensitive resin material, and the colored layer is likely to be increased in thickness. The spin coating method has a problem that an actual use efficiency of the photosensitive resin material is low. However, using the present invention, it is possible to form the colored layer having a desired film thickness by efficiently using the photosensitive resin material.

Application Example 9

In the method of manufacturing an organic EL device according to the application example, the forming of a convex portion may preferably form the convex portion by using the photosensitive resin material which does not include the coloring material.

According to the method, the convex portion and the colored layer are made of the same main material, thereby increasing an adhesion of the colored layer to the convex portion. In addition, the convex portion is formed using the photosensitive resin material which does not include the coloring material, so the convex portion of optical transparency is formed. Therefore, light emission from the organic EL element is not hindered by the formed convex portion, so that it is possible to manufacture the organic EL device having a high brightness.

Application Example 10

In the manufacturing method of an organic EL device according to the application example, the forming of the convex portion forms the convex portion using a metal material or a dielectric material.

According to the method, it is possible to configure a light blocking convex portion using the metal material, and it is possible to manufacture the organic EL device having an excellent symmetry in the viewing angle characteristics. In addition, in a case where the seal layer is formed using the inorganic material, by using the dielectric material, it is possible to form the convex portion having a more excellent adhesion with respect to the seal layer.

Application Example 11

In the manufacturing method of an organic EL device according to the application example, it is preferable that the forming of the convex portion form the convex portion so as to divide the sub-pixel in a plane manner.

According to the method, for example, compared to a case where the convex portion is formed in stripe shape (streaky shape), a contact area between the colored layer and the convex portion is increased, so that it is possible to manufacture the organic EL device with an improved adhesion to the convex portion of the colored layer.

Application Example 12

In a manufacturing method of an organic EL device according to the application example, it is preferable that the forming of a color filter form the colored layer of red, green, and blue in an order of the thinnest thickness of an object.

According to the method, the colored layers of red, green, and blue are formed using a spin coating method. Therefore, by forming the colored layers in a thin order of the film thickness, the color layers having a thin film thickness is covered and coated with the photosensitive resin material, so that it is easy to form a colored layer having a thick thickness with respect to the colored layer previously formed as aimed.

Application Example 13

According to this application example, there is provided an electronic equipment, including the organic EL device according to Application Example 12.

According to this application example, it is possible to provide the electronic equipment having an excellent display quality.

BRIEF DESCRIPTION OF THE DRAWINGS

The invention will be described with reference to the accompanying drawings, wherein like numbers reference like elements.

FIG. 11A is a graph of the viewing angle characteristics of relative brightness, and FIG. 11B is a graph of the viewing angle characteristics of a chromaticity change.

DESCRIPTION OF EXEMPLARY EMBODIMENTS

The followings describe a preferable embodiment of the present invention with reference to the accompanying drawings. The drawings in use are appropriately enlarged or reduced to be displayed so that a part to describe may be recognizable.

Incidentally, in the following embodiments, for example, if "on the substrate" is described without special description, there is a case of being disposed so as to be in contact with the substrate, a case of being disposed through other structures on the substrate, a case of being disposed so as for a portion to be in contact on the substrate, or a case where a portion is disposed through other structure.

First Embodiment

Organic EL Device

Figure 1:
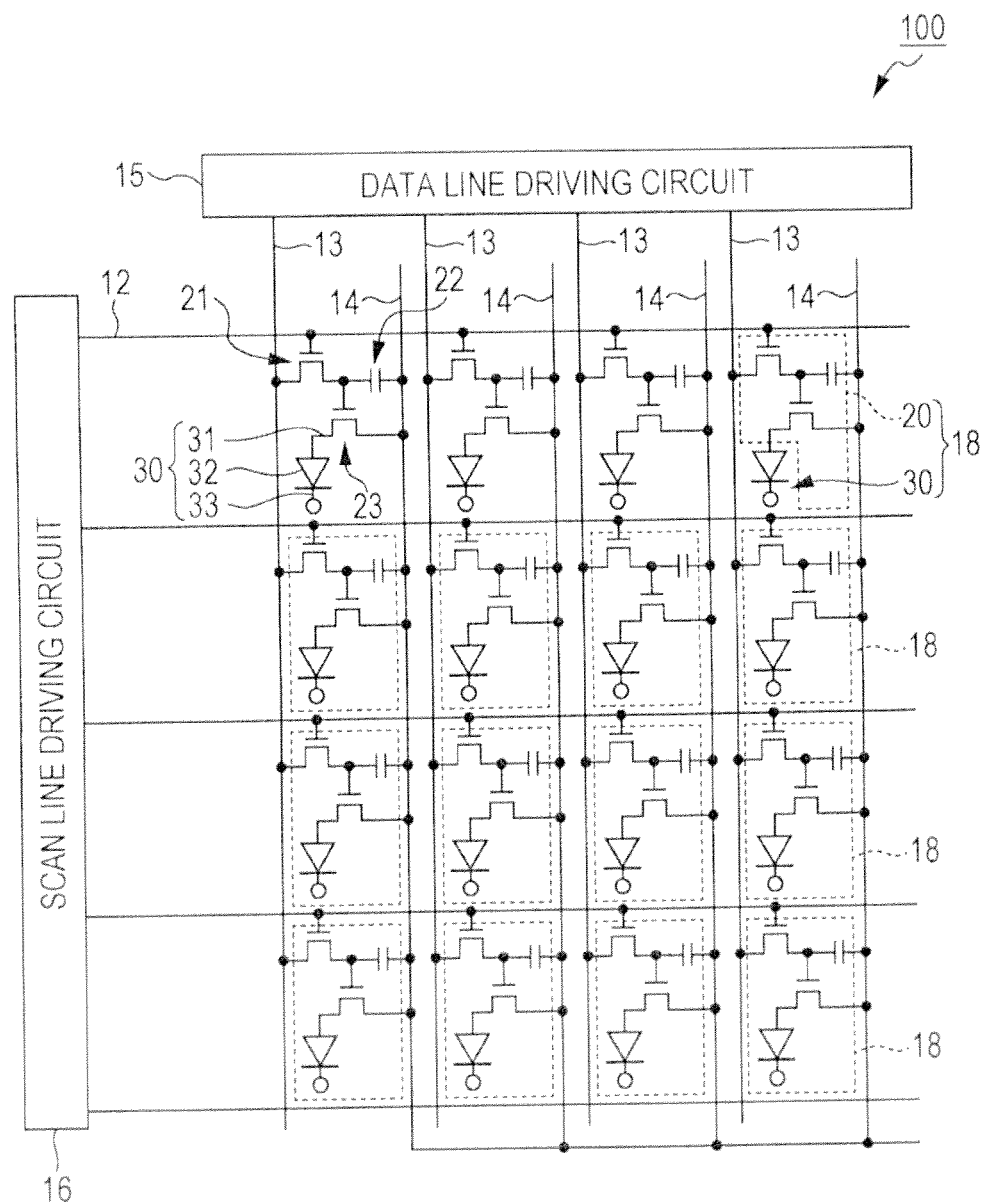
FIG. 1 is an equivalent circuit diagram illustrating an electrical configuration of an organic EL device of a first embodiment.
Figure 2:
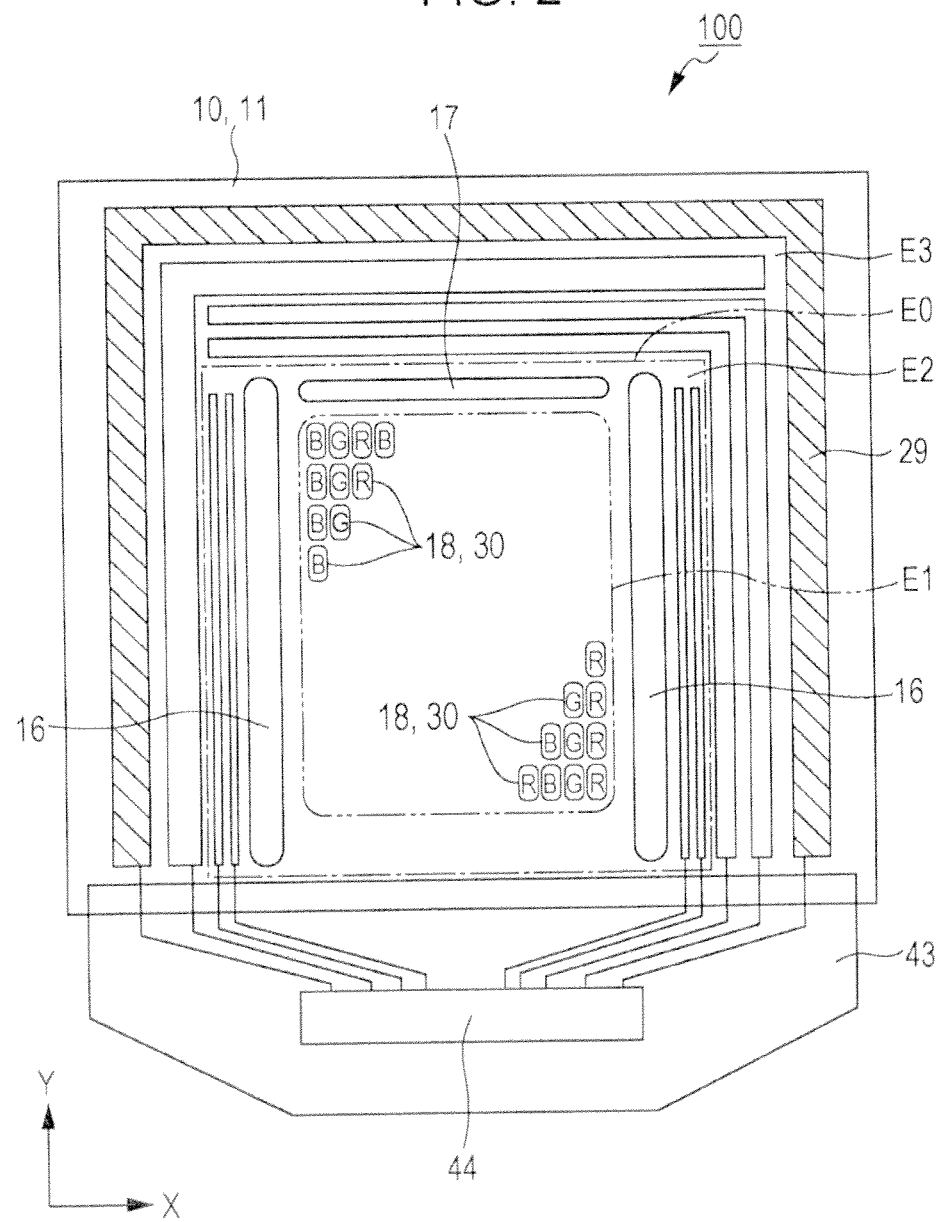
FIG. 2 is a schematic plan diagram illustrating a configuration of the organic EL device of the first embodiment.
Figure 3:
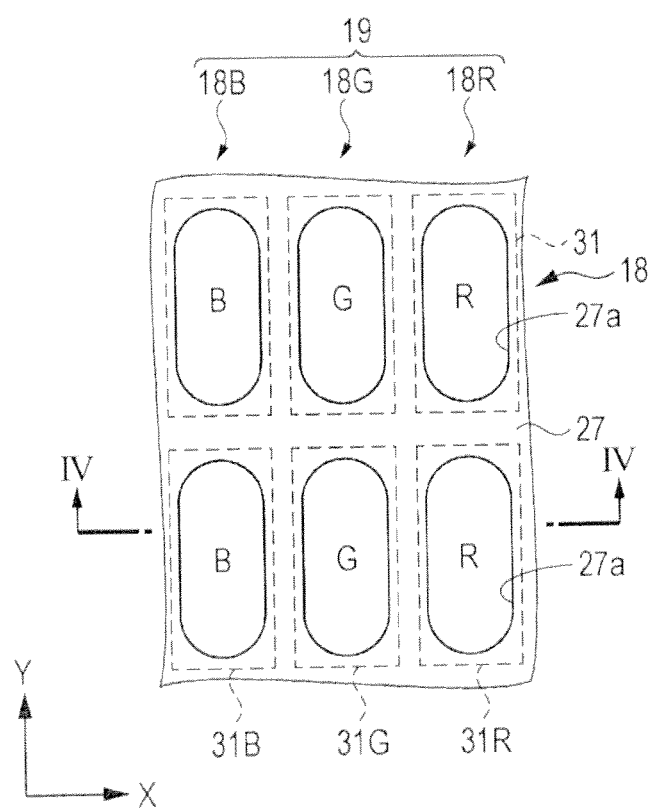
FIG. 3 is a schematic plan diagram illustrating disposition of sub pixels.
Figure 4:
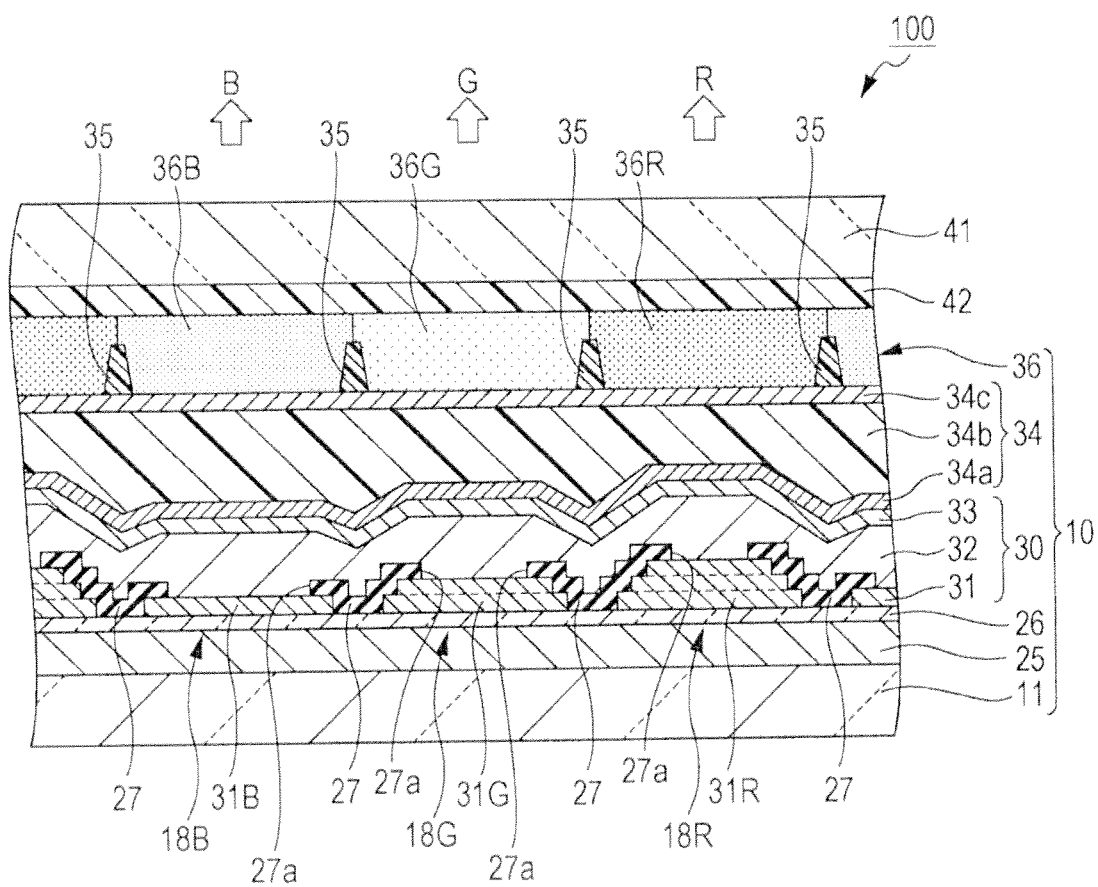
FIG. 4 is a schematic cross-sectional diagram illustrating a structure of sub-pixels taken along a line IV-IV of FIG. 3.

First of all, an organic EL device of the present embodiment will be described with reference to FIGS. 1 to 4. FIG. 1 is an equivalent circuit diagram illustrating an electrical configuration of the organic EL device of a first embodiment, FIG. 2 is a schematic plan diagram illustrating a configuration of the organic EL device of the first embodiment, FIG. 3 is a schematic plan diagram illustrating disposition of sub-pixels, and FIG. 4 is a schematic sectional-diagram illustrating a structure of sub-pixels taken along with a line IV-IV of FIG. 3.

As illustrated in FIG. 1, the organic EL device 100 of the present embodiment includes a plurality of scan lines 12 and a plurality of data lines 13 which are intersecting with one another, and a plurality of power supply lines 14 which is in parallel with the plurality of data lines 13, respectively. The organic EL device further includes a scan line driving circuit 16 where the plurality of scan lines 12 are connected and a data line driving circuit 15 where the plurality of data lines 13 are connected. In addition, the organic EL device further includes a plurality of sub-pixels 18 which are light emitting pixels corresponding to each intersection portion between the plurality of scan lines 12 and the plurality of data lines 13 and disposed in a matrix shape.

The sub-pixels 18 include an organic EL element 30 as a light emitting element, and a pixel circuit 20 controlling driving of the organic EL element 30.

The organic EL element 30 includes a pixel electrode 31 as an anode, a counter electrode 33 as a cathode, and a functional layer 32 provided between the pixel electrode 31 and the counter electrode 33. The organic EL element 30 may be referred to as a diode electrically. Detailed information will be described below. However, the counter electrode 33 is formed as a common cathode over the plurality of sub-pixels 18.

The pixel circuit 20 includes a switching transistor 21, a storage capacitor 22, and a driving transistor 23. For example, it is possible to configure the two transistors 21 and 23 using a n channel type or a p channel type thin film transistor (TFT) and a MOS transistor.

A gate of the switching transistor 21 is connected to the scan line 12, one of a source and a drain is connected to the data line 13, and the other of the source and the drain is connected to a gate of the driving transistor 23.

One of a source and a drain of the driving transistor 23 is connected to the pixel electrode 31 of the organic EL element 30, and the other of the source and the drain is connected to the power supply line 14. The storage capacitor 22 is connected between a gate of the driving transistor 23 and the power supply line 14.

If the scan line 12 is driven and the switching transistor 21 is in an ON state, a potential is held in the storage capacitor 22 through the switching transistor 21 based on a pixel signal provided from the data line 13 at that time. In response to potential of the storage capacitor 22, that is, gate potential of the driving transistor 23, On or Off state of the driving transistor 23 is determined. Then, if the driving transistor 23 is in an ON state, an amount of electric current according to the gate potential flows in the functional layer 32 interposed between the pixel electrode 31 and the counter electrode 33 through the driving transistor 23 from the power supply line 14. The organic EL element 30 emits light according to the amount of electric current flowing in the functional layer 32.

As illustrated in FIG. 2, the organic EL device 100 includes an element substrate 10. In the element substrate 10, a display region E0 (in drawings, illustrated using a one-dot dashed line) is provided, and at the outer side of the display region E0, a non-display region E3 is provided. The display region E0 includes an actual display region E1 (in drawings, illustrated using a two-dot dashed line), a dummy region E2 surrounding the actual display region E1.

In the actual display region E1, the sub-pixels 18 as a light emitting pixel is disposed in a matrix shape. The sub-pixel 18 includes the organic EL element 30 as a light emitting element as described above, and according to an operation of the switching transistor 21 and the driving transistor 23, the sub-pixels 18 are configured to obtain light emission of any one color of blue (B), green (G), and red (R).

In the present embodiment, the sub-pixels 18 from which light emission of the same color is obtained are arranged in a first direction, and the sub-pixels 18 from which light emission of different colors is obtained are arranged in a second direction intersecting (orthogonal) with the first direction to dispose the sub-pixels 18 in a so-called stripe method. Thereafter, the first direction is set to a Y direction, and the second direction is set to a X direction to provide description. Disposition of the sub-pixels 18 in the element substrate 10 is not limited to use the stripe method, but a Mosaic method and a Delta method may also be used.

A peripheral circuit to cause the organic EL element 30 of each sub-pixel 18 to emit light is mainly provided in a dummy region E2. For example, as illustrated in FIG. 2, at a position interposing the actual display region E1 in the X direction, a pair of scan line driving circuits 16 are extended in the Y direction and provided. At a position along the actual display region E1 between the pair of scan line driving circuits 16, the inspection circuit 17 is provided.

On one side portion parallel to the X direction of the element substrate 10 (the side portion of the lower part of the drawing), a flexible circuit board (FPC) 43 to achieve electrical connection with an external portion driving circuit is connected. In the FPC 43, a driving IC 44 which is connected to a peripheral circuit of the element substrate 10 side through the wiring of the FPC 43 is mounted on the FPC 43. The driving IC 44 includes a data line driving circuit 15 described above, and the data line 13 and the power supply line 14 of the element substrate 10 side are electrically connected to the driving IC 44 through the flexible circuit board 43.

Between the display region E0 and the outer edge of the element substrate 10, that is, in the non-display region E3, for example, wiring 29 to apply potential to the counter electrode 33 of the organic EL element 30 of each sub-pixel 18, and the like are formed. The wiring 29 is provided in the element substrate 10 so as to surround the display region E0 except a side portion of the element substrate 10 connected to the FPC 43.

Next, with reference to FIG. 3, a planar disposition of the sub-pixels 18, especially a planar disposition of the pixel electrode 31 will be described. As described in FIG. 3, sub-pixels 18B from which light emission of blue (B) is obtained, sub pixels 18G from which light emission of green (G) is obtained, sub-pixels 18R from which light emission of red (R) is obtained are sequentially arranged in the X direction. The sub-pixels 18 from which light emission of the same color is obtained are arranged to be adjacent to each other in the Y direction. A configuration is represented where three sub-pixel 18B, 18G, and 18R arranged in the X direction are set to one pixel 19. Disposition patch of the sub-pixels 18B, 18G, and 18R in the X direction is less than 5 μm. The sub-pixels 18B, 18G, and 18R are disposed at 0.5 μm to 1.0 μm intervals in the X direction. The disposition patch of the sub-pixels 18B, 18G, and 18R in the Y direction is less than approximately 10 μm.

The pixel electrode 31 in the sub-pixels 18 has a substantially rectangular shape, and the longitudinal direction is disposed along the Y direction. The pixel electrodes 31 is caused to correspond to a light emitting color to be referred to as the pixel electrode 31B, 31G, and 31R. An insulation film 27 is formed to cover the outer edge of each of the pixel electrodes 31B, 31G, and 31R. Accordingly, an opening portion 27a is formed on each of the pixel electrodes 31B, 31G, and 31R, and each of the pixel electrodes 31B, 31G, and 31R is exposed in the opening portion 27a. The opening portion 27a has a planar shape or a substantially rectangular shape.

In FIG. 3, disposition of the sub-pixels 18B, 18G, and 18R of different colors is provided in an order of blue (B), green (G), and red (R) from the left side in the X direction, but not limited thereto. For example, in the X direction, it can also be in an order of red (R), green (G), and blue (B).

Next, with reference to FIG. 4, a configuration of the sub-pixels 18B, 18G, and 18R will be described. As illustrated in FIG. 4, the organic EL device 100 includes a base material 11 as a substrate in the present invention, and a reflection layer 25, a transparent layer 26, pixel electrodes 31B, 31G, and 31R, the functional layer 32, and the counter electrode 33 of common cathode, which are sequentially formed on the basic material 11. In addition, the organic EL device 100 includes the seal layer 34 covering the counter electrode 33, and the color filter 36 formed on the seal layer 34. Furthermore, in order to protect the color filter 36, the organic EL device 100 further includes the counter substrate 41 disposed through the transparent resin layer 42. The element substrate 10 includes the basic material 11 to the color filter 36. In FIG. 4, a configuration of the driving transistor 23 and the like of the pixel circuit 20 in the element substrate 10 is not illustrated.

In the organic EL device 100, a top emission method through which light emitted from the functional layer 32 transmits the color filter 36 to be extracted from the counter substrate 41 side is employed. Accordingly, as the base material 11, it is possible to use not only a transparent substrate, for example, a glass substrate, but also a non-transparent substrate, for example, silicon or ceramics substrate. The counter substrate 41 is a substrate, such as a transparent glass, for example.

The reflection layer 25 formed on the base material 11 may be made of Al (aluminum) or Ag (silver), or an alloy of a metal having light reflectivity of these.

The transparent layer 26 achieves electrical insulation between the pixel electrode 31 to be formed later and the reflection layer 25, and it is possible to use an inorganic insulation film like SiOx (silicon oxide) and the like.

Corresponding to the sub-pixels 18B, 18G, and 18R, the pixel electrodes 31B, 31G, and 31R provided on the transparent layer 26 are made of a transparent conductive film, for example, Indium Tin Oxide (ITO), Indium Zinc Oxide (IZO), or the like to have different film thickness each other. Specifically, the film thickness increases in an order of blue (B), green (G), and red (R).

The functional layer 32 includes an organic light emitting layer from which white light is obtained, and is formed in common across the sub-pixels 18B, 18G, and 18R. The white light may be realized by combining an organic light emitting layers from which light emission of blue (B), green (G), and red (R) is obtained. In addition, it is possible to pseudo white light by combining the organic light emitting layers from which light emission of blue (B) and yellow (Y) is obtained.

The counter electrode 33 covering the functional layer 32, for example, is made of MgAg (magnesium silver) alloy, and the film thickness is controlled so as to include optical transparency and light reflectivity.

The seal layer 34 has a configuration where a first seal layer 34a, a flattened layer 34b, and a second seal layer 34c are sequentially stacked from the counter electrode 33 side.

The first seal layer 34a and the second seal layer 34c are formed using an inorganic material. As the inorganic material, for example, SiOx (silicon oxide), SiNx (silicon nitride), SiOxNy (silicon oxynitride), AlxOy (aluminum oxide) and the like are mentioned which are unlikely to pass through moisture or oxygen. As a method of forming the first seal layer 34a and the second seal layer 34c, a vacuum evaporation method, an ion plating method, a sputtering method, a CVD method, and the like are adopted. Considering that it is hard to apply damage like a heat to the organic EL element 30, it is preferable to employ the vacuum evaporation method or the ion plating method. The film thickness of the first seal layer 34a and the second seal layer 34c is 50 nm to 1000 nm, and preferably 200 nm to 400 nm so that a crack is unlikely to occur when forming a film and transparency is obtained.

The flattened layer 34b has a transparency and may be formed using a resin material of any one of a heat or ultraviolet curable epoxy resin, acrylic resins, urethane resins, and silicone resins. In addition, the flattened layer 34b may also be formed using an inorganic material of a coating type (silicon oxide and the like). The flattened layer 34b is formed to be stacked on the first seal layer 34a which covers a plurality of organic EL elements 30. The surface of the first seal layer 34a has convex and concave by receiving influence of the pixel electrodes 31B, 31G, and 31R whose thicknesses are different from each other. Accordingly, in order to make the convex and concave smooth, it is preferable to form the flattened layer 34b with the film thickness of 1 μm to 5 μm. Accordingly, the color filter 36 formed on the seal layer 34 is unlikely to receive influence of the convex and concave.

The second seal layer 34c covering the flattened layer 34b is formed using the above-mentioned inorganic material.

The color filter 36 is configured to include the colored layer 36B, 36G, and 36R of blue (B), green (G), and red (R) which are formed on the seal layer 34 using a photolithography method. The colored layers 36B, 36G, and 36R are formed corresponding to sub pixels 18B, 18G, and 18R.

In addition, on the seal layer 34, between the colored layers 36B, 36G, and 36R of the sub-pixels 18B, 18G, and 18R each having a different color, a convex portion 35 having optical transparency is provided. The height of the convex portion 35 on the seal layer 34 is lower (smaller) than the film thickness of the colored layers 36B, 36G, and 36R. A configuration of the convex portion 35 will be described in detail below. However, between the convex portions 35 on the seal layer 34, each of the colored layers 36B, 36G, and 36R is formed and the convex portion 35 is covered by any one of the colored layers 36B, 36G, and 36R.

In the organic EL device 100 of the present embodiment, an optical resonator is configured between the reflection layer 25 and the counter electrode 33. The film thickness of pixel electrodes 31B, 31G, and 31R of the sub-pixels 18B, 18G, and 18R is different from each other. Accordingly, optical distance in each optical resonator is different from each other. Accordingly, in each of the sub-pixels 18B, 18G, and 18R, light of resonant wavelength corresponding to each color is configured to be obtained.

A method of adjusting the optical distance in the optical resonator is not limited thereto, for example, in each of the sub-pixels 18B, 18G, and 18R, the film thickness of the transparent layer 26 and a material configuring the transparent layer 26 on the base material 11 may be different from each other.

Resonant light emitted from an optical resonator of each sub-pixel 18B, 18G, and 18R transmits each colored layer 36B, 36G, and 36R and is emitted from the transparent counter substrate 41 side. Since the color filter 36 is formed on the seal layer 34, compared to a case where the color filter 36 is formed on the counter substrate 41 side, color mixing due to light leakage between the sub-pixels 18B, 18G, and 18R is reduced. In such a structure of the sub-pixels 18B, 18G, and 18R, a planar size of the sub-pixels 18B, 18G, and 18R is decreased, that is, the color mixing may be effectively reduced as the structure has higher definition.

Figure 5A:
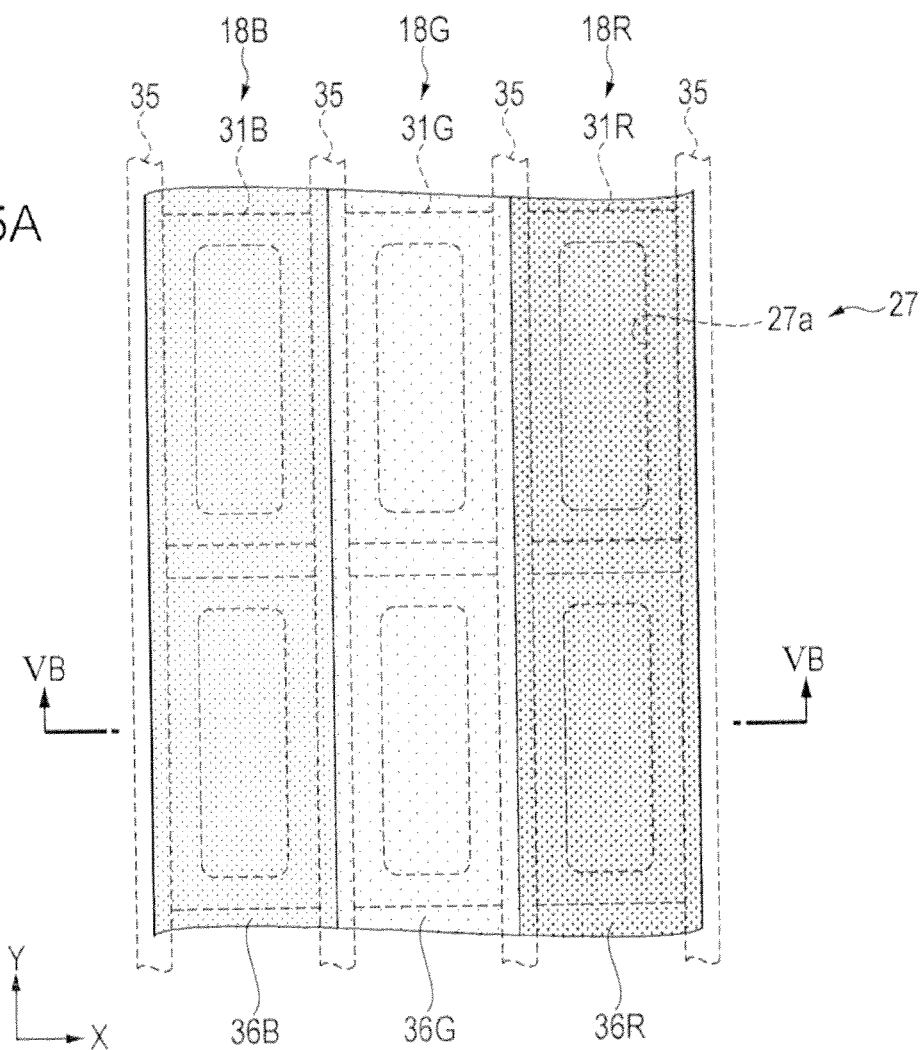
FIG. 5A is a schematic plan diagram illustrating disposition of a convex portion and a colored layer in the sub-pixel.
Figure 5B:
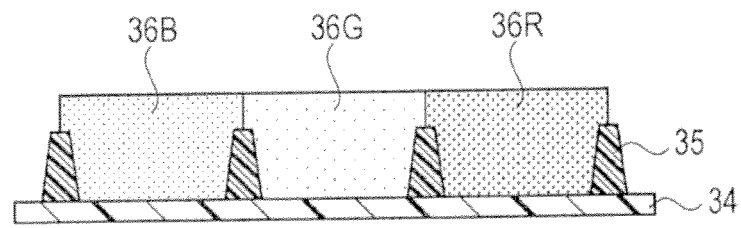
FIG. 5B is a main portion cross-sectional diagram of a color filter along a line VB-VB of FIG. 5A.
Figure 5C:
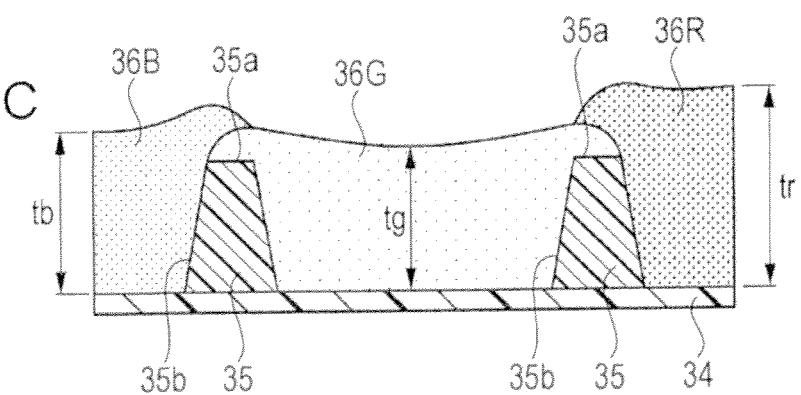
FIG. 5C is a main portion enlarged cross-sectional diagram of FIG. 5B.
Figure 6A:
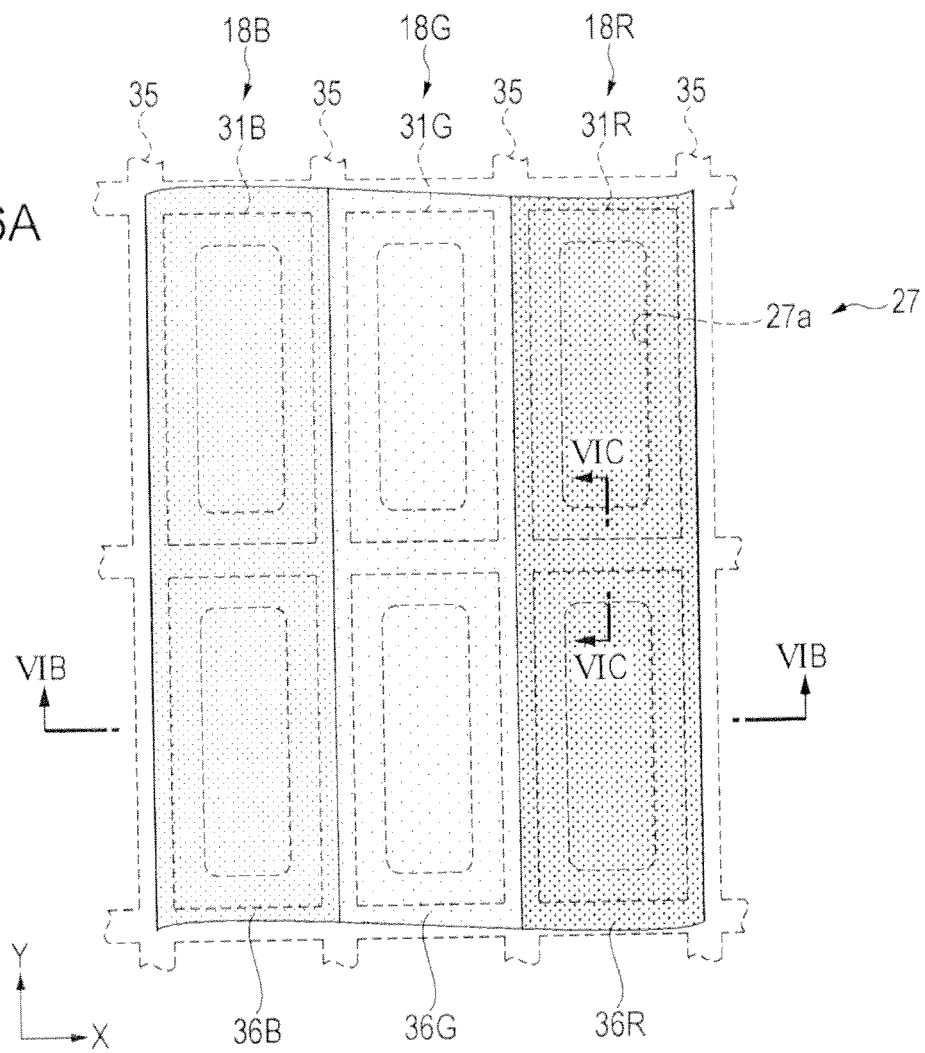
FIG. 6A is a schematic plan diagram illustrating disposition of the convex portion and the colored layer of a modification example.
Figure 6B:
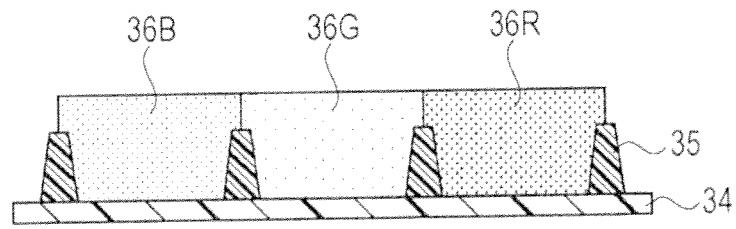
FIG. 6B is a main portion cross-sectional diagram of the color filter taken along a line VIB-VIB of FIG. 6A.
Figure 6C:
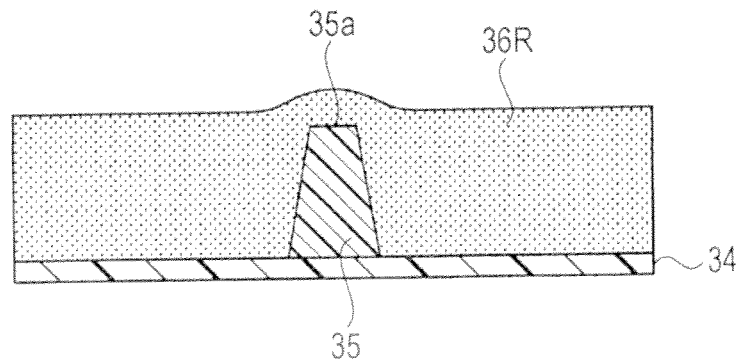
FIG. 6C is a main portion enlarged cross-sectional diagram taken along a line VIC-VIC of FIG. 6A.

Next, a relation between the convex portion 35 and the colored layers 36B, 36G, and 36R on the seal layer 34 will be described referring to FIGS. 5 and 6. FIG. 5A is a schematic plan diagram illustrating disposition of the convex portion and the colored layer in a sub-pixel, FIG. 5B is a main portion cross-sectional diagram of the color filter taken along a line of VB-VB of FIG. 5A, and FIG. 5C is a main portion enlarged cross-sectional diagram of FIG. 5B. FIG. 6A is a schematic plan diagram illustrating disposition of the convex portion and the colored layer of a deformation example, FIG. 6B is a main port cross-sectional diagram of the color filter taken along a line of VIB-VIB of FIG. 6A, and FIG. 6C is a main portion enlarged cross-sectional diagram taken along a line VIC-VIC of FIG. 6A.

As illustrated in FIGS. 5A and 5B, the color filter 36 of the organic EL device 100 in the present embodiment is disposed with the colored layer of the same color extending in the Y direction. That is, the colored layer 36B of blue (B) is disposed in a stripe shape across a plurality of sub-pixels 18B (pixel electrode 31B) arranged in the Y direction. Similarly, the colored layer 36G of green (G) is disposed in a stripe shape across a plurality of sub-pixels 18G (pixel electrode 31G) arranged in the Y direction. The colored layer 36R of red (R) is disposed in a stripe shape across a plurality of sub-pixels 18R (pixel electrode 31R) arranged in the Y direction. A boundary of each colored layer 36B, 36G, and 36R is located approximately in the center between the pixel electrodes 31 of adjacent sub-pixels 18 arranged in the X direction.

As illustrated in FIG. 5B, in the seal layer 34 side, between the colored layers 36B, 36G, and 36R of different colors, the convex portion 35 is disposed on the seal layer 34 so as to divide each of these colored layers 36B, 36G, and 36R. Accordingly, the convex portion 35 on the seal layer 34 is also disposed in a stripe shape (stripe shape) so as to extend in the Y direction.

The shape of a cross-sectional diagram of the convex portion 35 taken along a line VA-VA of FIG. 5A is a trapezoidal, and the bottom surface of the convex portion 35, as illustrated in FIG. 5A, is located between the pixel electrodes 31 of adjacent sub-pixels 18.

The outer edge of each pixel electrode 31 is covered by the insulation film 27, and the pixel electrode 31 in the opening portion 27a provided in the insulation film 27 is connected to the functional layer 32. Since the opening portion 27a in the sub-pixel 18 is a region to substantially contribute to light emission, the convex portion 35 may be formed so that the bottom surface of the convex portion 35 may superimpose the pixel electrode 31 in addition to the opening portion 27a.

In the present embodiment, the convex portion 35 of optical transparency is formed using a photosensitive resin material which does not contain the coloring material by the photolithography method. That is, a main material of the convex portion 35 and the colored layers 36B, 36G, and 36R is the same. The width of the convex portion 35 on the seal layer 34 is about 0.5 µm to 1.0 µm (preferably, the width of the bottom surface is 0.7µ, the width of the top portion 35a is 0.5 µm), and the height is about 1.1 µm. It is preferable that the height of the convex portion 35 be lower (smaller) than an average film thickness t of the colored layers 36B, 36G, and 36R, and be equal to or more than a half of the average film thickness t.

As illustrated in FIG. 5C, the film thickness of the colored layers 36B, 36G, an 36R in the present embodiment gets thicker in an order of green (G), blue (B), and red (R). Specifically, the average film thickness tg of the colored layer 36G is about 1.6 µm, the average film thickness tb of the colored layer 36B is about 1.9 µm, and the average film thickness tr of the colored layer 36R is about 2.0 µm. This is set considering the visual sensitivity of each color, and a white balance.

A method of forming the colored layers 36B, 36G, and 36R will be described in detail below. However, in the sub-pixel 18G, the colored layer 36G is formed so as to fill a space between the convex portions 35 facing in the X direction and to cover at least a portion of the top portion 35a of the convex portion 35. The colored layer 36B adjacent to the colored layer 36G is connected to the side wall 35b of the convex portion 35, and one edge portion of the colored layer 36B superimposes the edge portion of the colored layer 36G covering the top portion 35a of the convex portion 35. Similarly, the colored layer 36R adjacent to the colored layer 36G is connected to the side wall 35b of the convex portion 35, and one edge portion of the colored layer 36R superimposes the edge portion of the colored layer 36G covering the top portion 35a of the convex portion 35. That is, the colored layer 36G whose average film thickness tg is the thinnest (smallest) is formed so as to be connected to the edge portion of the seal layer 34, the top portion 35a and the side wall 35b of the convex portion 35, the edge portion of the colored layer 36B, and the edge portion of the colored layer 36R.

Deformation Example of Convex Portion

The convex portion 35 is not limited to be disposed in a stripe shape extending in the Y direction as illustrated in FIG. 5A. For example, as illustrated in FIG. 6A, in order to surround the opening portion 27a in the pixel electrode 31 of each sub-pixel 18, the convex portion 35 may extend in the X direction and the Y direction to be disposed in a lattice shape. Therefore, as illustrated in FIG. 6B, in the X direction, a space between the convex portions 35 is filled with the colored layers 36B, 36G, and 36R, respectively so as to cover the top portion 35a. In addition, as illustrated in FIG. 6C, the convex portion 35 located between the sub-pixels 18R of the same color in the Y direction includes the top portion 35a, and is covered by the colored layer 36R corresponding to the sub-pixel 18R. Accordingly, with respect to the colored layer 36R formed between the convex portions 35 in a stripe shape described above, a contact area of the colored layer 36R of a deformation example to the convex portion 35 is increased, so that the adhesion of the colored layer 36R increases. Similarly in the other colored layers 36B and 36G, the adhesion increases.

Method of Manufacturing Organic EL Device

Figure 7:
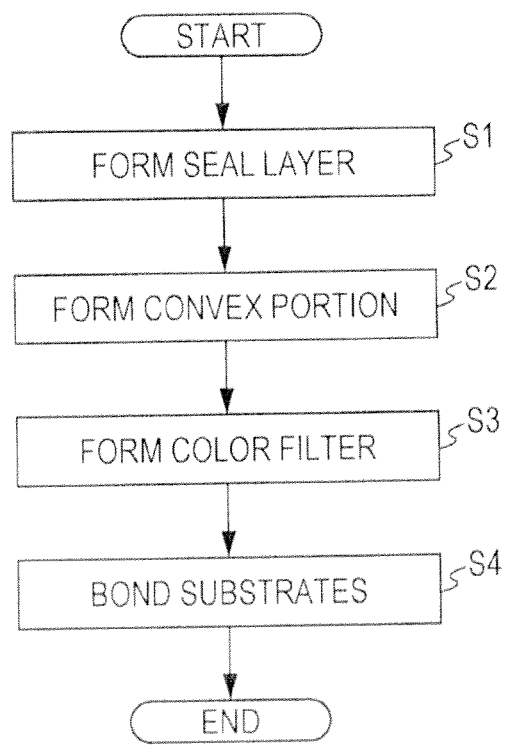
FIG. 7 is a flowchart illustrating the manufacturing method of the organic EL device of the first embodiment.

Next, a method of manufacturing the organic EL device in the present embodiment will be described referring to FIGS. 7 and 8A to 8F. FIG. 7 is a flowchart illustrating a method of manufacturing the organic EL device in the first embodiment, FIGS. 8A to 8F are schematic cross-sectional diagrams illustrating a method of manufacturing the organic EL device in the first embodiment.

As illustrated in FIG. 7, a method of manufacturing the organic EL device 100 in the present embodiment includes forming a seal layer (step S1), forming a convex portion (step S2), forming a color filter (step S3), and bonding substrates (step S4). As a method of forming the pixel circuit 20, the organic EL element 30, and the like on the base material 11, it is possible to adopt a known method. Accordingly, in FIGS. 8A to 8F, a configuration of the driving transistor 23 and the like of the pixel circuit 20 on the base material 11 and display of the reflection layer 25 and the transparent layer 26 are omitted. The followings are main features of the present invention, and steps S1 to S3 will be mainly described.

Figure 8A:
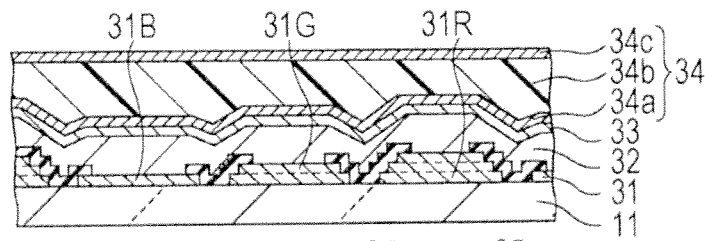
FIGS. 8A to 8F are schematic cross-sectional diagrams illustrating the manufacturing method of the organic EL device of the first embodiment.

In forming a seal layer in FIG. 7, as illustrated in FIG. 8A, first of all, a first seal layer 34*a* covering the counter electrode 33 is formed. As a method of forming the first seal layer 34*a*, for example, a method of performing vacuum evaporation on silicon oxide is adopted. The film thickness of the first seal layer 34*a* is about 200 nm to 400 nm. Next, the flattened layer 34*b* covering the first seal layer 34*a* is formed. As a method of forming the flattened layer 34*b*, for example, by using a solution including an epoxy resin having transparency and a solvent of the epoxy resin, and coating and drying the solution in a printing and spin coating method, the flattened layer 34*b* made of the epoxy resin is formed. The film thickness of the flattened layer 34*b* is preferably 1 μm to 5 μm. In this case, the thickness is set to 3 μm.

The flattened layer 34*b* is not limited to be formed using an organic material such as epoxy resin and the like, but as mentioned above, by coating, drying and baking inorganic material of coating type in the printing method, the film thickness of the flattened layer 34*b* may form a silicon oxide film of about 3 μm.

Subsequently, the second seal layer 34*c* covering the flattened layer 34*b* is formed. A method of forming the second seal layer 34*c* is the same as one for the first seal layer 34*a*, for example, a method of performing vacuum evaporation on silicon oxide is adopted. The film thickness of the second seal layer 34C is about 200 nm to 400 nm. Then, the procedure proceeds to step S2.

Figure 8B:
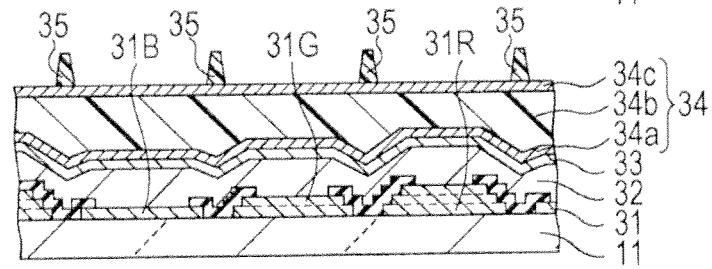

In the forming of the convex portion in FIG. 7 (step S2), the convex portion 35 is formed on the seal layer 34. As a method of forming the convex portion 35, by coating and prebaking the photosensitive resin material which does not include the coloring material using a spin coating method, a light sensing resin layer whose film thickness is about 1 μm is formed. The photosensitive resin material may be in a positive or negative type. By light-exposing and developing the light sensing resin layer using the photolithography method, as illustrated in FIG. 8B, the convex portion 35 is formed on the seal layer 34. By adjusting a light-exposing and developing condition, the convex portion 35 in the trapezoidal shape is formed so that the width of the bottom surface may be about 0.7 μm. A formation position of the convex portion 35 on the base material 11 is between the pixel electrodes 31B, 31G, and 31R corresponding to the adjacent sub-pixels 18B, 18G, and 18R of different colors. Then, the procedure proceeds to step S3.

Figure 8C:
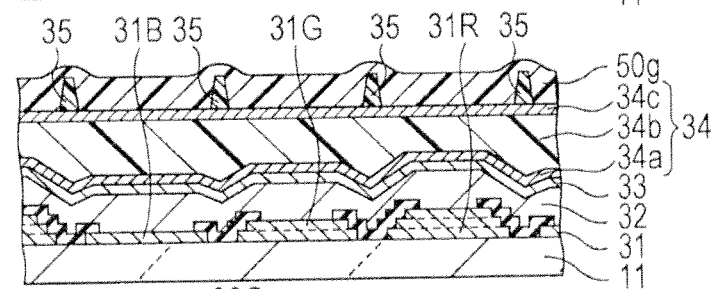
Figure 8D:
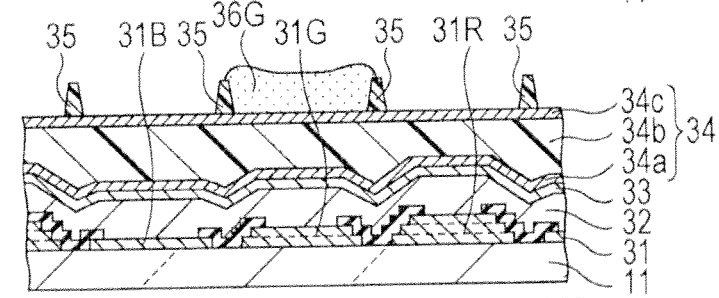

In the forming of the color filter in FIG. 7 (step S3), first of all, as illustrated in FIG. 8C, the surface of the seal layer 34 where the convex portion 35 is formed is coated with the photosensitive resin material having the coloring material of green color using the spin coating method to form a light sensing resin layer 50*g*. By light-exposing and developing the light sensing resin layer 50*g*, as illustrated in FIG. 8D, the colored layer 36G whose film thickness is the thinnest (smallest) is formed so as to fill a space between the convex portions 35 disposed on the pixel electrode 31G and to cover the top portion of the convex portion 35. The average film thickness of the colored layer 36*g* is about 1.6 μm.

Next, the surface of the seal layer 34 where the colored layer 36G is formed is coated with the photosensitive resin material having a coloring material of blue color using the spin coating method to form the light sensing resin layer 50*b*. By light-exposing and developing the light sensing resin layer 50*b*, the colored layer 36B is formed. The average film thickness of the colored layer 36B is about 1.9 μm.

Next, the surface of the seal layer 34 where the colored layer 36B and the colored layer 36G are formed is coated with the photosensitive resin material having a coloring material of red color by the spin coating method to form the light sensing resin layer 50*r*. By light-exposing and developing the light sensing resin layer 50*r*, the colored layer 36R is formed. The average film thickness of the colored layer 36R is about 2.0 μm.

That is, in the forming of the color filter, in a thin (small) order of the film thickness, the colored layers 36G, 36B, and 36R are formed.

Figure 8E:
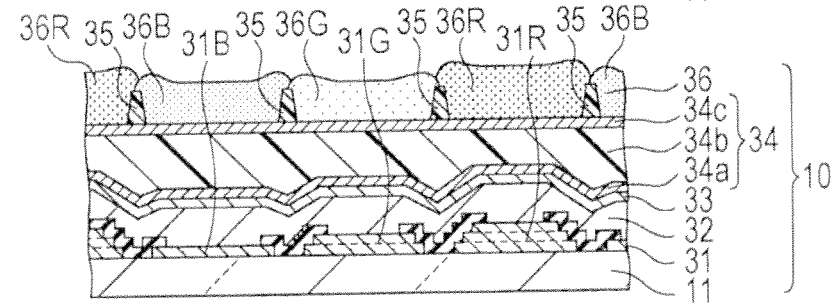

Accordingly, as illustrated in FIG. 8E, the colored layer 36B is formed between the convex portions 35 disposed on the pixel electrode 31B, the colored layer 36G is formed between the convex portions 35 disposed on the pixel electrode 31G, and the colored layer 36R is formed between the convex portions 35 disposed on the pixel electrode 31R.

One side (a left side in FIG. 8E) of the edge portion of the colored layer 36G in the X direction covers the top portion of the convex portion 35, and is covered using the edge portion of the colored layer 36R. The other side of the colored layer 36G in the X direction (a right side in FIG. 8E) covers the top portion of the convex portion 35, and is covered by the edge portion of the colored layer 36B. One side (the left side in FIG. 8E) of the edge portion of the colored layer 36B in the X direction covers the top portion of the convex portion 35, and is covered using the edge portion of the colored layer 36R. The other side of the edge portion of the colored layer 36B in the X direction (the right side in FIG. 8E) covers a side of the edge portion of the colored layer 36G. One side (the left side in FIG. 8E) of the edge portion of the colored layer 36R in the X direction covers the edge portion of the colored layer 36G. The other side (the right side in FIG. 8E) of the edge portion of the colored layer 36R in the X direction covers the edge portion of the colored layer 36B. Then, the procedure proceeds to step S4.

Figure 8F:
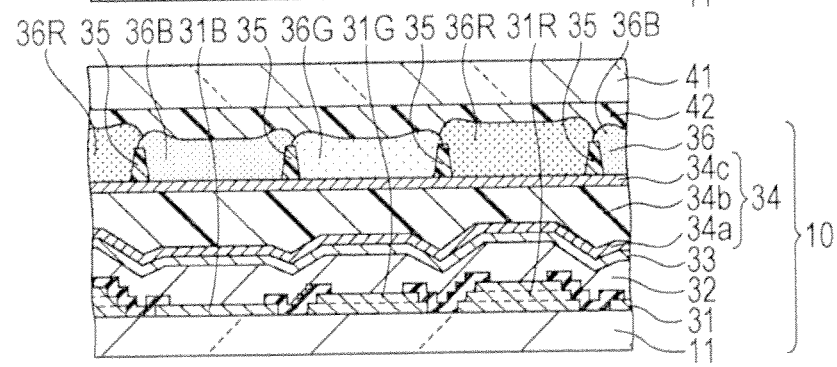

In the bonding of the substrates in FIG. 7 (step S4), as illustrated in FIG. 8F, a transparent resin material having a property of adhesion is coated so as to cover the color filter 36. Then, the counter substrate 41 is disposed at a predetermined position to be opposite to the base material 11 coated with the transparent resin material, for example, the counter substrate 41 is compressed against the base material 11 side. Accordingly, the element substrate 10 and the counter substrate 41 are caused to be bonded through the transparent resin layer 42 made of the transparent resin material. The transparent resin material, for example, is thermo-curable type epoxy resin. The thickness of the transparent resin layer 42 is about 10 μm to 100 μm.

Thereafter, as illustrated in FIG. 2, a FPC 43 is mounted on a terminal portion of the element substrate 10 to complete the organic EL device 100.

Figure 9A:
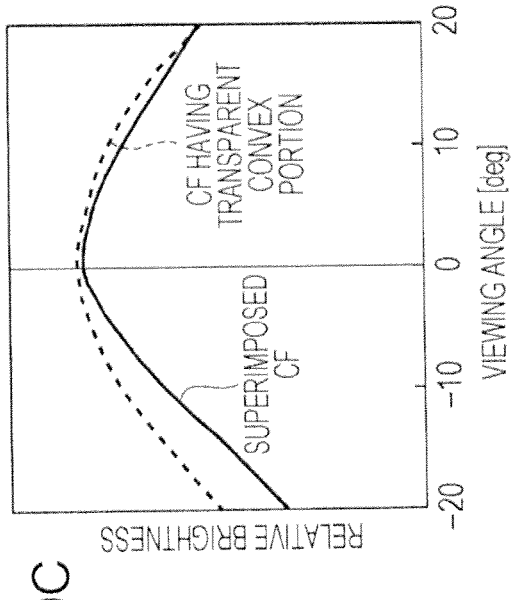
FIG. 9A is a schematic cross-sectional diagram illustrating the organic EL device of a comparison example.
Figure 9B:
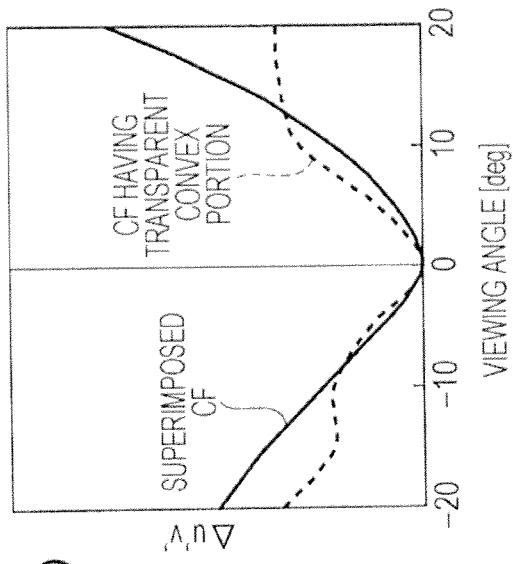
FIG. 9B is a schematic cross-sectional diagram illustrating the organic EL device of the first embodiment.
Figure 9C:
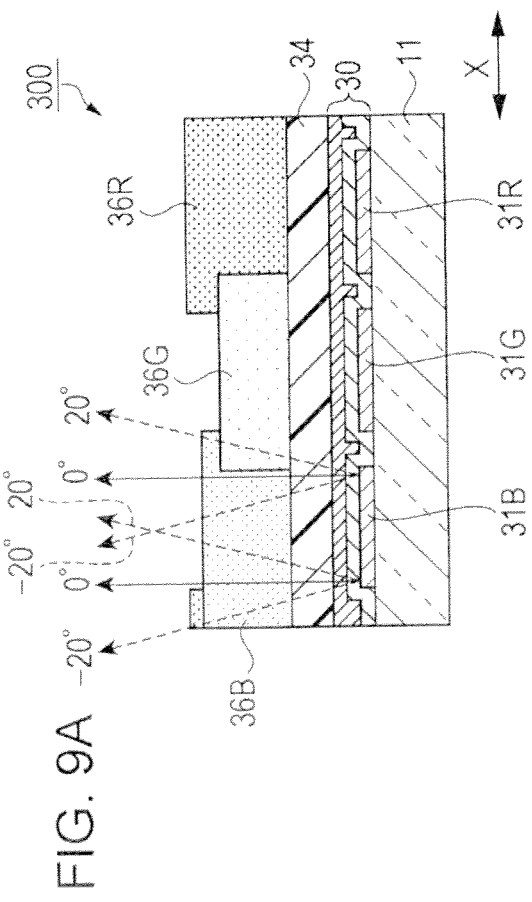
FIG. 9C is a graph illustrating the viewing angle characteristics according to relative brightness.
Figure 9D:
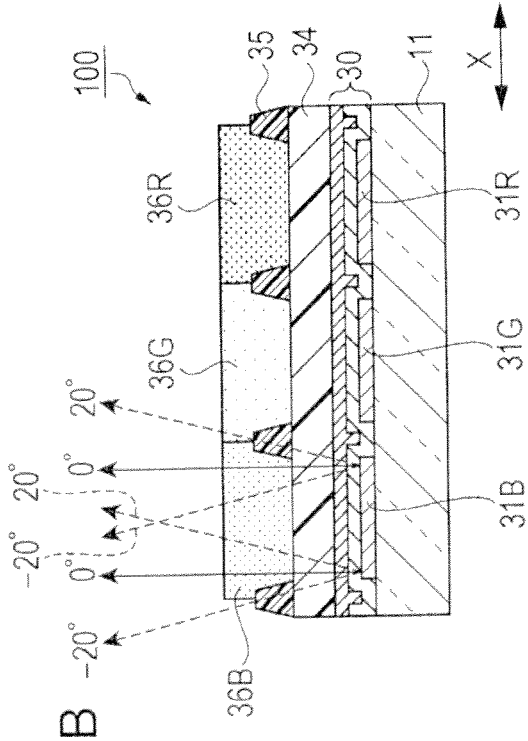
FIG. 9D is a graph illustrating the viewing angle characteristics according to chromaticity change.

Next, the viewing angle characteristics in the organic EL device 100 of the present embodiment will be described referring to a comparison example. FIGS. 9A to 9D are drawings describing the viewing angle characteristics of the organic EL device in the comparison example and the organic EL device in the present embodiment. FIG. 9A is a schematic cross-sectional diagram illustrating the organic EL device in the comparison example, FIG. 9B is a schematic cross-sectional diagram illustrating the organic EL device according to the first embodiment, FIG. 9C is a graph illustrating the viewing angle characteristics related to relative brightness, and FIG. 9D is a graph illustrating the viewing angle characteristics related to chromaticity change.

As illustrated in FIG. 9A, an organic EL device 300 of the comparison example has a configuration of so-called a superimposed CF where the colored layers of different colors are superimposed each other in the boundary of sub-pixels having the organic EL element 30. In order to compare the viewing angle characteristics of the organic EL device 100 in the present embodiment illustrated in FIG. 9B, disposition of the colored layers 36B, 36G, and 36R and a tendency in an average film thickness are the same as the organic EL device 100. In the organic EL device 300 of the comparison example, the average film thickness is thicker in an order of the colored layer 36G (the average film thickness is 1.1 μm), the colored layer 36B (average film thickness is 1.4 μm), and the colored layer 36R (average film thickness is 1.5 μm). The average film thickness of the colored layer 36G is the thinnest (smallest), the edge portion of one side of the colored layer 36G (a left side of FIG. 9A) is covered with the edge portion of the colored layer 36B, and the edge portion of the other side of the colored layer 36G (a right side of FIG. 9A) is covered with the edge portion of the colored layer 36R. The edge portion of one side of the colored layer 36B (a left side of FIG. 9A) is covered with the edge portion of the colored layer 36R.

The viewing angle characteristics of the organic EL device 100 in the embodiment and the organic EL device 300 of the comparison example are compared in relative brightness illustrated in FIG. 9C in a sub-pixel of blue color and a chromaticity change (Δu' v') illustrated in FIG. 9D. A time when the sub-pixel of blue color on the base material 11 is viewed from a normal line direction (0°) is set as a reference, in a range of ±20° in the X direction with respect to the normal line, and the relative brightness and the chromaticity change (Δu' v') are quantified and graphed using an optical simulator. The chromaticity change (Δu' v') indicates the chromaticity change in a u' v' chromaticity diagram (CIE 1976 UCS chromaticity diagram) which is a uniform chromaticity diagram.

Setting the sub-pixel of blue color to a comparison object is selected since there is a possibility that the degree of relative brightness and chromaticity change (Δu' v') becomes remarkable as compared to that in the sub-pixels of green color and red color when light emission from the organic EL element 30 transmits the colored layer of other colors which is different from the colored layer which the light emission has to originally transmit.

Additionally, a range of the viewing characteristics is set to ±20° in the X direction with respect to a normal line of the base material 11. This is caused to be a required condition when a head mounted display 1000 as an electronic equipment to be described (refer to FIG. 12) is equipped with the organic EL device 100. A micro-display like the organic EL device 100 in the present embodiment allows a user to visually recognize an image (display light) through an optical system such as a general lens. Therefore, an angular range for an optical axis in an optical system of display light absorbed in the optical system is defined.

In the organic EL device 300 of the comparison example, light emitted from the organic EL element 30 at an angle of +20° in the X direction transmits the colored layer 36G of green and the edge portion of the colored layer 36B of blue at the boundary of the sub-pixels. Light emitted from the organic EL element 30 at an angle of −20° in the X direction transmits the colored layer 36B of blue and the edge portion of the colored layer 36R of red.

In the organic EL device 100 of the present embodiment, light emitted from the organic EL element 30 at an angle of +20° in the X direction, at the boundary of the sub-pixels, transmits the convex portion 35, the colored layer 36G of green covering the top portion of the convex portion 35, and the edge portion of the colored layer 36B of blue. Light emitted from the organic EL element 30 at an angle of −20° in the X direction, at the boundary of sub-pixels, transmits the convex portion 35, the colored layer 36B of blue covering the top portion of the convex portion 35, and the edge portion of the colored layer 36R of red.

As illustrated in FIG. 9C, in the organic EL device 100 (CF having a transparent convex portion) and the organic EL device 300 (superimposed CF), since the organic EL device 300 (superimposed CF) has an increased ratio for light to transmit a portion the colored layer of different colors is superimposed at the boundary of the sub-pixels compared to the organic EL device 100 (CF having a transparent convex portion), a change in relative brightness when a viewing angle is vibrated at 0°±20° is decreased at the organic EL device 100 (CF having a transparent convex portion). In addition, in the organic EL device 300, since a ratio of light to transmit the colored layer 36R of red which has lower transmission ratio of light than the colored layer 36G of green increases at −20° side, relative brightness at −20° side is lower than at +20°, and symmetry of changes in the relative brightness on the viewing angle characteristics is also inferior to that in the organic EL device 100.

A chromaticity change, for the same reason, as illustrated in FIG. 9D, in the organic EL device 100 (CF having a transparent convex portion) and the organic EL device 300 (superimposed CF), in a range of the viewing angle of 0°±10°, that much difference does not occur, however, the chromaticity change at the organic EL device 300 (superimposed CF) when the viewing angle is vibrated from 10° to 20° or −10° to −20° is greater than at the organic EL device 100 (CF having a transparent convex portion).

It is ideal that the relative brightness change and the chromaticity change in the viewing angle characteristics are unlikely to receive an influence in spite of a change in the viewing angle. However, it is also an important factor to maintain the symmetry in the relative brightness change and the chromaticity change with respect to the change in the viewing angle. According to the organic EL device 100 (CF having a transparent convex portion) of the present embodiment, compared to the organic EL device 300 (superimposed CF) of the comparison example, the symmetry of the viewing angle characteristics in the relative brightness and the chromaticity change is realized in a viewing angle range of ±20°.

According to the organic EL device 100 of the first embodiment and a method of manufacturing thereof, the following effects are obtained.

(1) On the seal layer 34 corresponding to between the sub-pixels 18 of different colors in the X direction, the convex portion 35 is formed whose height is lower than the colored layers 36B, 36G, and 36R, and which has an optical transparency. Therefore, between the sub-pixels 18, compared to a case where the colored layer of different colors are superimposed each other, it is possible to reduce the rate of the light emission from the organic EL element 30 transmitting the colored layers of other colors other than the colored layer which the light has to originally transmit. Accordingly, it is possible to provide and manufacture the organic EL device 100 where symmetry of the viewing angle characteristics is realized in the relative brightness change and the chromaticity change.

(2) The convex portion 35 is formed using the photosensitive resin material which does not include a coloring material, and the convex portion 35 and the colored layer 36B, 36G, and 36R of the color filter 36 have the same main material. In addition, the colored layers 36B, 36G, and 36R are formed in a thin order of the film thickness, the top portion 35a of the convex portion 35 is covered by any colored layer of one color among the colored layers 36B and 36G, and the edge portion of the colored layer of the other color is covered with the colored layer covering the top portion 35a. Therefore, adhesion of the colored layers 36B, 36G, and 36R for the convex portion 35 is increased compared to a case where the convex portion 35 is not present. That is, the adhesion of the colored layer 36B, 36G, and 36R for the seal layer 34 is improved, so that the colored layers 36B, 36G, and 36R are unlikely to be peeled with respect to an environmental change like heat and the like and it is possible to provide and manufacture the organic EL device 100 having high reliability.

(3) The colored layers 36B, 36G, and 36R are formed by light-exposing and developing the light sensing resin layer including the coloring material, which is coated and formed using a spin coating method so as to cover the surface of the seal layer 34 where the convex portion 35 is formed. Therefore, compared to a case where the convex portion 35 is not formed, a space between the convex portions 35 is filled with the photosensitive resin material, so that it is easy to make the film of the colored layers 36B, 36G, and 36R thicker. In other words, it is possible to form the colored layers 36B, 36G, and 36R having the film thickness of an object by efficiently using the photosensitive resin material.

(4) A cross-sectional shape along the X direction of the convex portion 35 on the seal layer 34 is in a trapezoidal shape, and an area of the bottom surface in contact with the seal layer 34 is larger than an area of the top portion 35a. Therefore, while ensuring the symmetry in the viewing angle characteristics, it is possible to ensure the adhesion of the convex portion 35 to the seal layer 34.

Second Embodiment

Other Organic EL Device and Manufacturing Method Thereof

Figure 10:
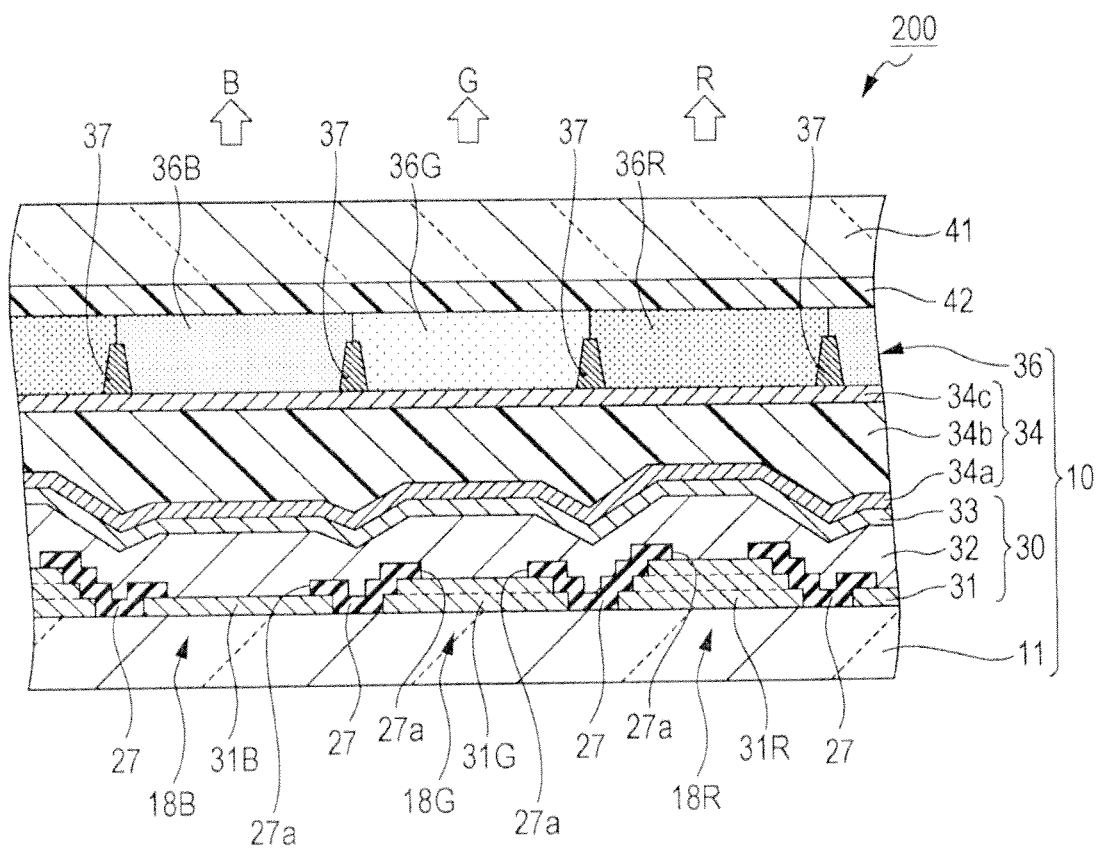
FIG. 10 is a main portion schematic cross-sectional diagram illustrating a structure of a sub-pixel of the organic EL device of a second embodiment.

Next, an organic EL device of a second embodiment will be described referring to FIG. 10. FIG. 10 is a main portion schematic cross-sectional diagram illustrating a structure of sub-pixels of the organic EL device of the second embodiment. The organic EL device of the second embodiment causes a configuration of the convex portion 35 to be different from that of the organic EL device 100 of the first embodiment. Therefore, In the same configuration as the first embodiment, the same number is applied to omit detailed description. FIG. 10 corresponds to FIG. 4, and does not illustrate the driving transistor 23 and the like or the reflection layer 25 and the transparent layer 26 which configure the pixel circuit 20 on the base material 11 in the same manner as FIG. 4.

As illustrated in FIG. 10, the organic EL device 200 of the embodiment forms an element substrate 10 which has a base material 11, a plurality of organic EL elements 30 formed for each of sub-pixels 18B, 18G and 18R on the base material 11, a seal layer 34 covering and sealing a plurality of the organic EL elements 30 and a color filter 36 formed on the seal layer 34. The organic EL devices 200 has a counter substrate 41 arranged to oppose the color filter 36 side of the element substrate 10 via a transparent resin layer 42. The organic EL device 200 is a top emission type in which the light emission from the respective organic EL elements 30 is transmitted to the colored layers 36B, 36G and 36R of the color filter 36 and fetched out from the counter substrate 41. The disposition of the sub-pixels 18B, 18G and 18R is not limited to this, but for example, the disposition may be in an order of the sub-pixel 18R, the sub-pixel 18G and the sub-pixel 18B from the left side in FIG. 10.

The organic EL element 30 has a pixel electrode 31 as an anode, a counter electrode 33 as a cathode, and a functional layer 32 formed between the pixel electrode 31 and the counter electrode 33 and emitting white light. The pixel electrode 31 is independently disposed for each of the sub-pixels 18B, 18G and 18R, and in some cases, may be referred to as pixel electrodes 31B, 31G and 31R corresponding to the colors of the sub-pixels 18. The counter electrode 33 is formed as a common cathode which is in common to a plurality of the organic EL elements 30. The functional layer 32 is also formed in common across the respective pixel electrodes 31B, 31G and 31R.

The seal layer 34 covering a plurality of the organic EL elements 30 on the base material 11 is one where a first seal layer 34a, a flattened layer 34b and a second seal layer 34c are sequentially stacked from the counter electrode 33 side.

A convex portion 37 is formed on the seal layer 34 corresponding to the space between the sub-pixels 18. In the organic EL device 100 of the first embodiment described above, the convex portion 35 has optical transparency, but the convex portion 37 of the embodiment has a light blocking effect. Specifically, the convex portion 37 is formed by using metallic materials such as Al (aluminum). The arrangement of the planar convex portion 37 on the seal layer 34 may be a stripe shape extending in the Y direction similarly to the convex portion 35 of the above-described first embodiment. However, as illustrated in FIG. 6A, it is preferable that the convex portion 37 be disposed in a lattice shape so as to divide the sub-pixels 18B, 18G and 18R. That is, the convex portion 37 corresponds to one which is called BM (black matrix). However, different from the general BM, the convex portion 37 does not simply enclose the sub-pixels 18 to block the light. The convex portion 37 has a thinner (smaller) film thickness than the average thickness of the colored layers 36B, 36G and 36R on the seal layer 34, and has a height of the half the average film thickness or greater. In addition, the cross-sectional shape of the convex portion 37 in the X direction is a trapezoid. Hereinafter, the convex portion 37 is referred to as BM 37.

In a manufacturing method of the organic EL device 200, in the convex portion forming (step S2) in the manufacturing method of the organic EL device 100 of the above-described first embodiment, for example, an Al film is deposited on the surface of the seal layer 34 so as to have the film thickness of approximately 1 µm, and the BM (convex portion) 37 having the lattice shape is formed through patterning by a photolithographic method. The BM (convex portion) 37 is formed so that the cross-sectional shape is the trapezoid. The width of the bottom surface of the BM (convex portion) 37 in the X direction is 0.5 µm to 1.0 µm, and preferably 0.7 µm. The processes except for step S2 are the same as those of the first embodiment.

Figure 11A:
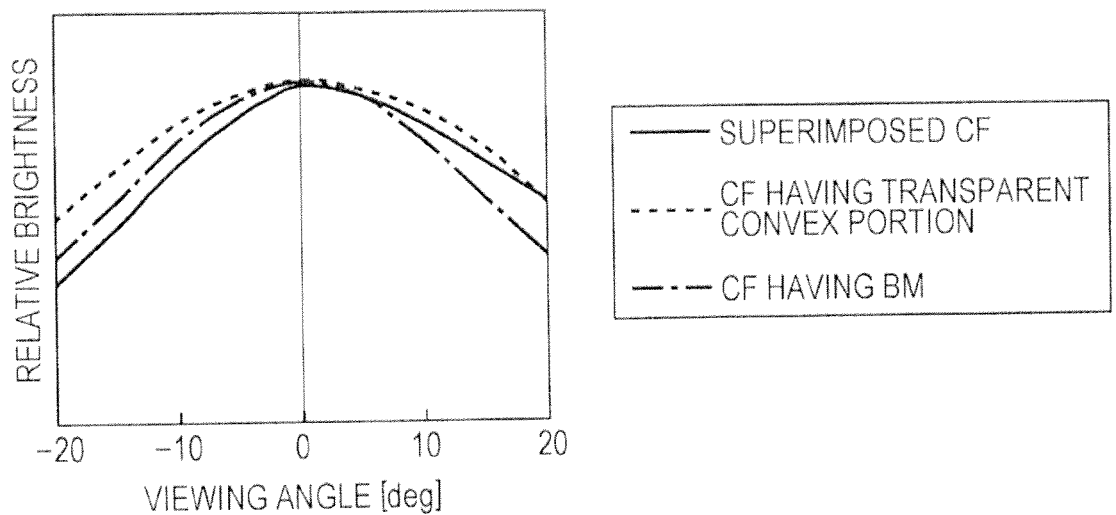
FIGS. 11A and 11B illustrate the viewing angle characteristics of a superimposed CF, a CF having a transparent convex portion and a CF having BM.
Figure 11B:
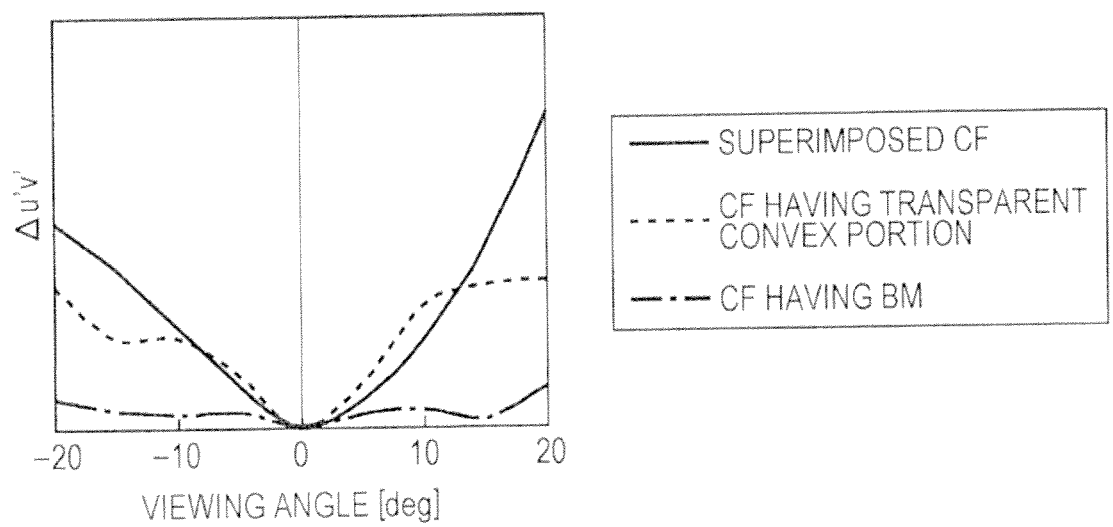

FIGS. 11A and 11B illustrate viewing angle characteristics among a superimposed CF, a CF with a transparent convex portion and a CF with the BM. FIG. 11A illustrates a graph of the viewing angle characteristics of relative brightness. FIG. 11B illustrates a graph of the viewing angle characteristics of a color change.

FIGS. 11A and 11B have the graph of the organic EL device 200 (CF having a BM) in addition to the graphs in FIGS. 9C and 9D illustrated above.

As illustrated in FIG. 11A, the organic EL device 200 of the embodiment including the CF with the BM is inferior to the organic EL device 100 (CF with the transparent convex portion) of the first embodiment in a viewpoint of utilization efficiency of the light, and thus a change in the relative brightness with respect to a change in the viewing angle is large. In contrast, in a viewing angle range of ±20°, the symmetry of the relative brightness change is superior to one in the organic EL device 300 (superimposed CF) of the comparison example.

In addition, as illustrated in FIG. 11B, the organic EL device 200 (CF having BM) of the embodiment includes BM 37, and thus has a smaller color change (Δu'v') than the organic EL device 100 (CF with the transparent convex portion) and the organic EL device 300 (superimposed CF) of the comparison example, that is, dependence on the viewing angle in the color change (Δu'v') is improved.

According to the organic EL device 200 (CF having BM) of the embodiment, it is possible to realize the viewing angle characteristics having an excellent symmetry. In other words, in a case where chromaticity change is extremely inhibited in the viewing angle range, the organic EL device 200 is effective. On the other hand, in a case where the symmetry of chromaticity change in the viewing angle range and relative brightness change are required to be inhibited, the organic El device 100 of the first embodiment is effective.

In addition, a CF having a transparent convex portion or a CF having a BM is formed on the seal layer 34, and a configuration where the excellent symmetry is realized on the viewing angle characteristics becomes effective as the sub-pixels 18 get a higher definition. Therefore, the organic EL device 100 and the organic EL device 200 which are adopted to the invention are micro-displays which include the sub-pixels 18 with high definition which has a disposition pitch less than about 5 μm in the X direction.

Third Embodiment

Electronic Equipment

Figure 12:
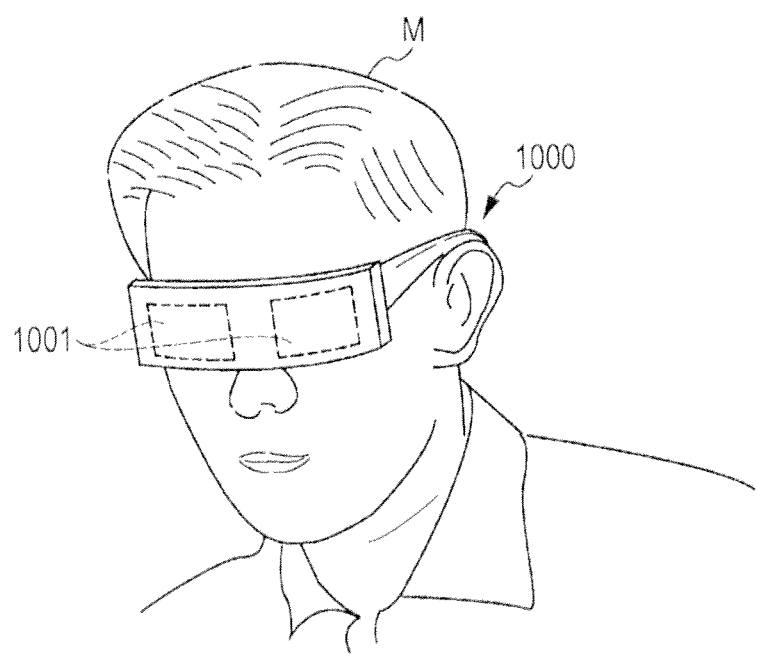
FIG. 12 is a schematic diagram illustrating a head mounted display as electronic equipment.

Next, an electronic equipment of the embodiment will be described referring to FIG. 12. FIG. 12 is a schematic diagram illustrating a head mounted display as the electronic equipment.

As illustrated in FIG. 12, a head mounted display (HMD) 1000 as an electronic equipment of the embodiment includes two display units 1001 provided corresponding to left and right eyes. By mounting the head mounted display 1000 on a head like glasses, a viewer M may see a letter or an image displayed on the display unit 1001. For example, when an image is displayed considering parallax on the left and right display units 1001, it is possible to see and enjoy a three-dimensional image.

In the display units 1001, the organic EL device 100 of the above described first embodiment (or the organic EL device 200 of the above described second embodiment) is mounted. Therefore, it is possible to have an excellent display quality and to provide a small and light head mounted display 1000 which is excellent in cost performance.

The head mounted display 1000 is not limited to have two display units 1001, and may be configured to have one display unit 1001 corresponding to any one of left and right.

The electronic equipment where the organic EL device 100 or the organic El device 200 is mounted is not limited to the head mounted display 1000. For example, an electronic equipment is adapted which has a display unit such as a personal computer or a portable type information terminal, a navigator, a viewer, a head up display, and the like.

The present invention is not limited to the above described embodiment, and may be appropriately modified and changed within a range not departing from the subject matter and spirit of the invention which can be read from claims and the entire specification. An organic EL device along the modification, a method of manufacturing the organic EL device, and electronic equipment where the organic EL device is applied are included in a technical scope of the present invention. Various modifications can be considered except the above described embodiment. Hereinafter, a description will be given with a modification example.

Modification Example 1

In the above described first embodiment, a configuration of a colored layer covering the top portion 35a of the convex portion 35 is not limited thereto. In a case where the convex portion 35 has an optical transparency, when light emission of the organic EL element 30 transmits the convex portion 35, and is emitted from the counter substrate 41 side as it is, light leakage occurs in a color display, thereby leading to a decrease in contrast. Therefore, the height of the convex portion 35 is preferably lower (smaller) than an average film thickness of the colored layers 36B, 36G, and 36R, and it is preferable that the top portion 35a be covered by the colored layers 36B, 36G and 36R. Accordingly, it is not limited to cover using any one of the colored layers 36B, 36G, and 36R, for example, a colored layer of two different colors may have a configuration to be in contact with the top portion 35a of the convex portion 35 each other.

Modification Example 2

In the above described first embodiment, the convex portion 35 having an optical transparency is not limited to be formed using the photosensitive resin material. For example, if the convex portion 35 is formed using a dielectric material such as CrOx (chromium oxide), SiOxNy (silicon oxynitride), AlOx (aluminum oxide), TaOx (tantalum oxide), TiOx (titanium oxide), and the like, it is possible to form the convex portion 35 having high adhesion to the second seal layer 34c made of inorganic material, which is a top layer of the seal layer 34.

Modification Example 3

A cross-sectional shape along the X direction of the convex portion 35 of the above described first embodiment is not limited to a trapezoidal shape. For example, the cross-sectional shape may be a long rectangular shape in a normal direction of the base material 11. In a viewing angle of ±20° in the X direction with respect to a normal line, even if light emitted from the organic EL element 30 transmits the convex portion 35 in a rectangular shape, the convex portion 35 is covered by the colored layer. Accordingly, it is possible to ensure the symmetry in the viewing angle characteristics. As a method of forming the convex portion 35 in a rectangular shape having an optical transparency, a method is mentioned which forms the convex portion 35 in a rectangular shape by performing anisotropic etching, for example, using dry etching, on a dielectric layer, which is formed using a dielectric material mentioned in the modification example 2.

Modification Example 4

In the organic EL device 100 of the above described first embodiment and the organic EL device 200 of the above described second embodiment, a light emitting pixel provided in the actual display region E1 is not limited to sub-pixels 18B, 18G, and 18R corresponding to light emission of blue (B), green (G), and red (R). For example, a sub-pixel 18Y from which light emission of yellow (Y) other than the above described three colors may also be included. Accordingly, it is possible to further enhance the color reproductivity.

The present application claims priority to Japanese Patent Application No. 2012-237564 filed in the Japanese Patent Office on Oct. 29, 2012, the entire contents of which are incorporated herein by reference.

What is claimed is:

1. An organic EL device, the organic EL device comprising:
   a first substrate;
   a second substrate;
   an electrode disposed between the first substrate and the second substrate;
   a first pixel electrode that is disposed between the electrode and the first substrate and that consists of a transparent conductive film;
   a second pixel electrode that is disposed between the electrode and the first substrate and that consists of the transparent conductive film;
   an organic light emitting layer that is disposed between the first pixel electrode and the electrode and that is disposed between the second pixel electrode and the electrode;
   a color filter layer comprising:
      a first color filter that overlaps with the first pixel electrode in plan view, and
      a second color filter that overlaps with the second pixel electrode in plan view;
   a seal layer that is disposed between the electrode and the color filter layer and that includes an inorganic material, the seal layer that is in contact with the first color filter and the second color filter; and
   a convex portion disposed between the first color filter and the second color filter, and having a top surface that is covered by the first color filter and the second color filter, and a bottom surface in contact with a surface of the seal layer that is in contact with the first color filter and the second color filter,
   wherein a first side of the convex portion is in contact with the first color filter and a second side, opposite to the first side, is in contact with the second color filter.

2. The organic EL device according to claim 1, wherein light emitted from the organic light emitting layer is white light.

3. The organic EL device according to claim 2, wherein the organic light emitting layer comprises a blue organic light emitting layer, a green organic light emitting layer, and a red organic light emitting layer.

4. The organic EL device according to claim 2, wherein the organic light emitting layer comprises a blue organic light emitting layer, and a yellow organic light emitting layer.

5. The organic EL device according to claim 1, wherein the first and second color filters contact with the seal layer.

6. The organic EL device according to claim 1, wherein a thickness of the first pixel electrode is different from that of the second pixel electrode.

7. The organic EL device according to claim 1, wherein the seal layer comprises:
   a first seal layer that contacts the electrode and is made of inorganic material;
   a second seal layer that contacts the first color filter, the second color filter, and a convex portion; and
   a flattened layer provided between the first seal layer and the second seal layer.

8. An organic EL device, the organic EL device comprising:
   a first substrate;
   a second substrate;
   a first light emitting element that is disposed between the second substrate and the first substrate, the first light emitting element having a first optical resonator with a first optical distance;
   a second light emitting element that is disposed between the second substrate and the first substrate, the second light emitting element having a second optical resonator with a second optical distance different from the first optical distance;
   a color filter layer comprising:
      a first color filter that overlaps with a first pixel electrode of the first light emitting in plan view, and
      a second color filter that overlaps with a second pixel electrode of the second light emitting element in plan view;
   a seal layer that is disposed (i) between the first light emitting element and the color filter layer and (ii) between the second light emitting element and the color filter layer and that includes an inorganic material, the seal layer that is in contact with the first color filter and the second color filter;
   a convex portion disposed between the first color filter and the second color filter, and having a top surface that is covered by the first color filter and the second color filter, and a bottom surface in contact with a surface of the seal layer that is in contact with the first color filter and the second color filter;
   a reflection layer that is disposed (i) between the first pixel electrode and the first substrate and (ii) between the second pixel electrode and the first substrate, the reflection layer having light reflectivity;
   a transparent layer disposed (i) between the first pixel electrode and the reflection layer and (ii) between the second pixel electrode and the reflection layer; and
   a resin layer that is disposed between the color filter layer and the second substrate and that has property of adhesion,
   wherein a first side of the convex portion is in contact with the first color filter and a second side, opposite to the first side, is in contact with the second color filter,
   a first thickness of the transparent layer, which is a distance between the first pixel electrode and the reflection layer, is different from a second thickness of the transparent layer, which is a distance between the second pixel electrode and the reflection layer, and
   the first pixel electrode and the second pixel electrode consist of a transparent conductive film.

9. An organic EL device, the organic EL device comprising:
   a first substrate;

a second substrate;

a first light emitting element that is disposed between the second substrate and the first substrate, the first light emitting element having a first optical resonator;

a second light emitting element that is disposed between the second substrate and the first substrate, the second light emitting element having a second optical resonator;

a color filter layer comprising
- a first color filter that overlaps with a first pixel electrode of the first light emitting element in plan view, and
- a second color filter that overlaps with a second pixel electrode of the second light emitting element in plan view;

a seal layer that is disposed (i) between the first light emitting element and the color filter layer and (ii) between the second light emitting element and the color filter layer and that includes an inorganic material, the seal layer that is in contact with the first color filter and the second color filter;

a convex portion disposed between the first color filter and the second color filter, and having a top surface that is covered by the first color filter and the second color filter, and a bottom surface in contact with a surface of the seal layer that is in contact with the first color filter and the second color filter;

a reflection layer that is disposed (i) between the first pixel electrode and the first substrate and (ii) between the second pixel electrode and the first substrate, the reflection layer having light reflectivity;

a transparent layer disposed (i) between the first pixel electrode and the reflection layer and (ii) between the second pixel electrode and the reflection layer; and a resin layer that is disposed between the color filter layer and the second substrate and that has property of adhesion, wherein a first side of the convex portion is in contact with the first color filter and a second side, opposite to the first side, is in contact with the second color filter, resonant light from the first optical resonator is different from that from the second optical resonator, a first thickness of the transparent layer, which is a distance between the first pixel electrode and the reflection layer, is different from a second thickness of the transparent layer, which is a distance between the second pixel electrode and the reflection layer, and the first pixel electrode and the second pixel electrode consist of a transparent conductive film.

10. An electronic device comprising the organic EL device according to claim 1.

11. An electronic device comprising the organic EL device according to claim 2.

12. An electronic device comprising the organic EL device according to claim 3.

13. An electronic device comprising the organic EL device according to claim 4.

14. An electronic device comprising the organic EL device according to claim 5.

15. An electronic device comprising the organic EL device according to claim 6.

16. An electronic device comprising the organic EL device according to claim 7.

17. An electronic device comprising the organic EL device according to claim 8.

18. An electronic device comprising the organic EL device according to claim 9.

19. The organic EL device according to claim 1, further comprising:
- a reflection layer that is disposed (i) between the first pixel electrode and the first substrate and (ii) between the second pixel electrode and the first substrate, the reflection layer having light reflectivity;
- a transparent layer disposed (i) between the first pixel electrode and the reflection layer and (ii) between the second pixel electrode and the reflection layer; and
- a resin layer that is disposed between the color filter layer and the second substrate and that has property of adhesion, wherein a first thickness of the transparent layer, which is a distance between the first pixel electrode and the reflection layer, is different from a second thickness of the transparent layer, which is a distance between the second pixel electrode and the reflection layer.

* * * * *